(12) United States Patent
Sato

(10) Patent No.: US 6,791,661 B2
(45) Date of Patent: Sep. 14, 2004

(54) GAS REPLACEMENT METHOD AND APPARATUS, AND EXPOSURE METHOD AND APPARATUS

(75) Inventor: Tatsuo Sato, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/731,669

(22) Filed: Dec. 8, 2000

(65) Prior Publication Data

US 2002/0126269 A1 Sep. 12, 2002

(30) Foreign Application Priority Data

Dec. 9, 1999 (JP) ............................................ 11-350851

(51) Int. Cl.[7] ........................ G03B 27/52; G03B 27/42; G03B 27/54
(52) U.S. Cl. ............................ 355/30; 355/53; 355/67
(58) Field of Search ............................. 355/30, 53, 67, 355/72–77; 430/5, 20, 30, 311; 378/34, 35; 310/10, 12

(56) References Cited

U.S. PATENT DOCUMENTS

| | | | | |
|---|---|---|---|---|
| 4,737,824 A | * | 4/1988 | Sakai et al. ..................... | 355/53 |
| 5,422,704 A | * | 6/1995 | Sego ............................. | 355/53 |
| 5,453,816 A | * | 9/1995 | Wang ............................ | 355/75 |
| 5,559,584 A | * | 9/1996 | Miyaji et al. .................. | 355/73 |
| 5,883,704 A | | 3/1999 | Nishi et al. .................... | 355/67 |
| 6,153,044 A | * | 11/2000 | Klebanoff et al. ............ | 156/345 |
| 6,317,479 B1 | * | 11/2001 | Chiba et al. .................. | 378/35 |
| 6,337,161 B2 | * | 1/2002 | Chiba et al. .................. | 430/5 |
| 6,340,541 B1 | * | 1/2002 | Yoo .............................. | 430/5 |

FOREIGN PATENT DOCUMENTS

| | | |
|---|---|---|
| JP | A 8-166475 | 6/1996 |
| JP | A 8-330224 | 12/1996 |
| JP | A 9-73167 | 3/1997 |
| JP | A-9-197652 | 7/1997 |
| JP | A-2000-19721 | 1/2000 |
| WO | WO00/55891 | 9/2000 |

* cited by examiner

Primary Examiner—Henry Hung Nguyen
(74) Attorney, Agent, or Firm—Oliff & Berridge, PLC

(57) ABSTRACT

An exposure apparatus includes a preliminary chamber which accommodates a mask on which a pellicle is attached, an exhaust device which exhausts a gas from the preliminary chamber, a deformation measuring device which measures the deformation of the pellicle, and a control section which regulates the amount of a gas to be exhausted from the preliminary chamber. At the time of replacing a gas in a space by exhausting the gas from the preliminary chamber, the control section adjusts the exhaust amount of the gas from the preliminary chamber based on the result of the measurement made by the deformation measurement device so that the deformation of the pellicle is within a predetermined range. This can ensure stable gas replacement while preventing the pellicle from being damaged.

37 Claims, 8 Drawing Sheets

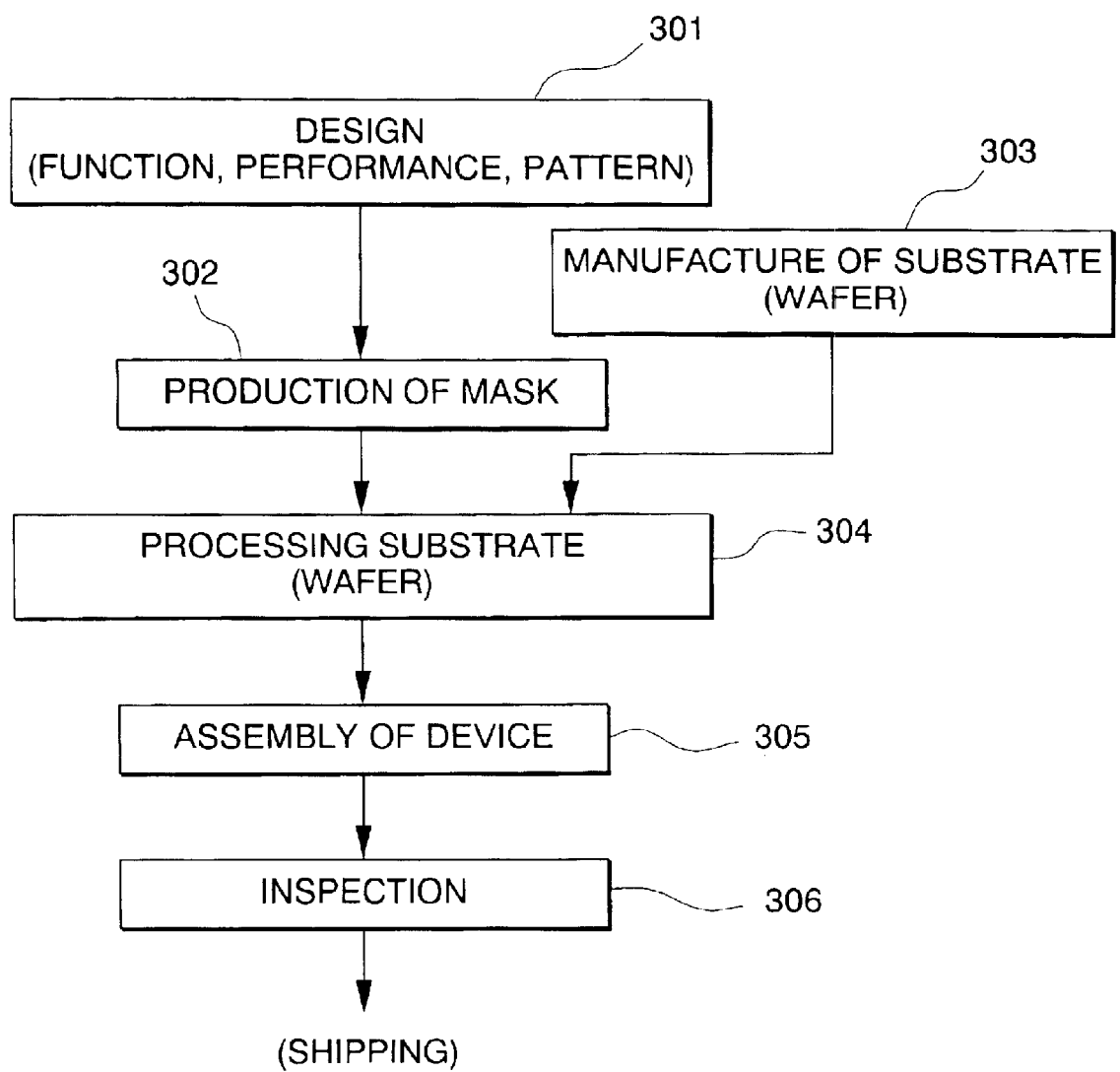

GAS REPLACEMENT METHOD AND APPARATUS, AND EXPOSURE METHOD AND APPARATUS

BACKGROUND OF THE INVENTION

1. Field of the Invention

The present invention relates to a gas replacement method and apparatus, and an exposure method and apparatus, which are used in the exposure process in, for example, the fabrication of semiconductor devices.

2. Description of the Related Art

Various exposure apparatuses have been used heretofore in manufacturing semiconductor devices, thin-film magnetic heads, liquid crystal displays or the like using the photolithography technology. A typical exposure apparatus among them projects the image of a pattern formed on a photomask or reticle (hereinafter called "mask") on a substrate whose surface is coated with a photosensitive agent, such as a photoresist, via a projection optical system. Due to the recent miniaturization of patterns to be projected on shot areas on a substrate, the wavelengths of illumination light for exposure (hereinafter called "exposure light") to be used are becoming shorter. In other words, exposure apparatuses that use a KrF excimer laser (248 nm) and ArF excimer laser (193 nm) are being made into practical use and are taking the place of those using a mercury lamp that has been popular. Further, there is an active development on exposure apparatuses that use an $F_2$ laser (157 nm) in order to achieve further pattern miniaturization.

When vacuum ultraviolet rays having a wavelength of about 180 nm or lower are used as exposure light, the exposure light is attenuated and cannot reach onto the substrate with a sufficient intensity if a substance which has a strong light absorptive characteristic with respect to light of such a wavelength band, such as oxygen molecules, hydrogen molecules or carbon dioxide molecules, (hereinafter called "light absorptive substance") is present in the optical path space where the exposure light travels. In this respect, exposure apparatuses that use vacuum ultraviolet rays are designed to improve the sealability of the optical path space where the exposure light travels, thereby blocking a light absorptive substance coming from outside, and perform a work of reducing the light absorptive substance present in the optical path space. Methods of reducing the light absorptive substance include a method of vacuuming the inside of the optical path space to reduce the internal pressure and then keeping the vacuum state, a method of filling the vacuumed space with a substance which shows low absorption characteristic with regard to exposure light (e.g., an inert gas such as helium, argon or nitrogen gas), and a method of supplying such an inert gas into the optical path space without vacuuming the space.

Typical masks have a transparent thin film called "pellicle" attached to the pattern surface in order to prevent adherence of dust or like to the pattern surface. When the aforementioned vacuum ultraviolet rays are used as exposure light, therefore, it is also necessary to reduce a light absorptive substance in the space that is formed between the pellicle and the mask. As the pellicle is easily damaged, it is hard to stably execute gas replacement of reducing the light absorptive substance in this space and supplying an inert gas there.

SUMMARY OF THE INVENTION

Accordingly, it is an object of the present invention to provide a gas replacement method and apparatus, and an exposure method and apparatus, which can stably and efficiently replace a gas in the space formed between a thin film and a substrate, such as a pellicle and a mask.

To achieve the above object, a gas replacement method according to one aspect of the invention adjusts the exhaust amount of a gas from a closed chamber which accommodates a substrate with which a thin film is provided so that deformation of the thin film due to the exhaust is within a predetermined range from the closed chamber.

According to the aspect of the invention, a substrate is accommodated in the closed chamber and the gas in the closed chamber is exhausted to thereby replace a gas in the space that is formed between the thin film and the substrate. As the exhaust amount of the gas from the closed chamber is adjusted so that the deformation of the thin film is within a predetermined range, stable gas replacement can be executed while preventing the thin film from being damaged.

In this case, the exhaust amount of the gas from the closed chamber is adjusted based on the result of measuring the deformation of the thin film, the thin film is surely prevented from being damaged at the time of carrying out gas replacement.

This gas replacement method can be realized by a gas replacement apparatus which comprises a closed chamber which accommodates a substrate with a thin film placed thereon; an exhaust device which is connected to the closed chamber and exhausts a gas from the closed chamber; a deformation measuring device which is associated with the thin film and measures deformation of the thin film; and a control system which is connected to the deformation measuring device and adjusts the exhaust amount of the gas based on the result of that measurement so that the deformation of the thin film is within a predetermined range.

The pressure in the closed chamber may be measured so that the exhaust amount is adjusted based on the result of that measurement. In this case too, the thin film is surely prevented from being damaged at the time of performing gas replacement.

This gas replacement method can be realized by a gas replacement apparatus which comprises a closed chamber which accommodates a substrate with a thin film placed thereon; an exhaust device which is connected to the closed chamber and exhausts a gas from the closed chamber; a pressure measuring device which is provided with the closed chamber and measures a pressure in the closed chamber; and a control system which is connected to the pressure measuring device and adjusts the exhaust amount of the gas based on the result of that measurement so that the deformation of the thin film is within a predetermined range.

As a replacement gas is supplied into the closed chamber, the replacement gas is supplied into the space that is formed between the thin film and the substrate. At the time of supplying the replacement gas into the closed chamber, at least one of the supply amount of the replacement gas and the exhaust amount of the gas is adjusted so that the deformation of the thin film due to the supply of the replacement gas is within a predetermined range. This can ensure stable gas replacement while preventing the thin film from being damaged. This can be accomplished by providing a gas supply device in the gas replacement apparatus, which supplies a replacement gas into the closed chamber, and allowing the control system to adjust at least one of the supply amount of the replacement gas and the exhaust amount of the gas from the closed chamber so that the deformation of the thin film is within the predetermined range.

According to another aspect of the invention, there is provided a gas replacement method for replacing a gas in a space formed between a substrate and a thin film to be provided with the substrate, wherein at the time of exhausting the gas from the space, the exhaust amount of the gas from the space is adjusted so that deformation of the thin film due to the exhaustion is within a predetermined range.

That is, the gas in the space formed between the substrate and the thin film may be replaced directly, in which case as the exhaust amount of the gas from the space is adjusted so that the deformation of the thin film is within a predetermined range, stable gas replacement can be executed while preventing the thin film from being damaged.

This gas replacement method can be achieved by a gas replacement apparatus which replaces a gas in a space formed between a substrate and a thin film to be provided with the substrate and comprises an exhaust device which exhausts a gas from the space; a deformation measuring device which measures deformation of the thin film; and a control system which adjusts the exhaust amount of the gas based on the result of that measurement so that the deformation of the thin film is within a predetermined range.

A replacement gas may be supplied into the space directly in which case stable gas replacement can be ensured by adjusting at least one of the supply amount of the replacement gas and the exhaust amount of the gas so that the deformation of the thin film due to the supplement of the replacement gas is within the predetermined range at the time of supplying the replacement gas into the space. This can be accomplished by providing a gas supply device in the gas replacement apparatus, which supplies a replacement gas into the space, and allowing the control system to adjust at least one of the supply amount of the replacement gas and the exhaust amount of the gas from the space so that the deformation of the thin film is within the predetermined range.

According to another aspect of the invention, there is provided an exposure method comprising the steps of accommodating a mask on which a protection member is provided via a frame into a closed chamber having at least one of a first space including an optical path of exposure light and a second space adjacent to said first space; replacing a gas in the closed chamber with a predetermined gas which demonstrates low absorption of the exposure light; replacing a gas in a space formed between the protection member and the mask with the predetermined gas according to replacing the gas in the closed chamber; and irradiating the exposure light onto the mask after the latter gas replacement and transferring an image of a pattern of the mask onto a substrate.

According to the invention, the mask is accommodated in the preliminary chamber and the gas in the preliminary chamber is replaced with a replacement gas to thereby replace a gas in the space formed between the protection member and the mask with the replacement gas. It is however possible to ensure stable gas replacement while preventing the protection member from being damaged, by adjusting the exhaust amount of the gas from the preliminary chamber so that the deformation of the protection member is within the predetermined range. As the mask is placed in the space that includes the optical path with a light absorptive substance in this space reduced, therefore, stable exposure is carried out.

This exposure method can be realized by an exposure apparatus which comprises a closed chamber which accommodates a mask on which a protection member is provided via a frame, the closed chamber having at least one of a first space including an optical path of exposure light and a second space adjacent to said first space; a gas replacement apparatus which is provided with the closed chamber and replaces a gas in the closed chamber with a predetermined gas which demonstrates low absorption of the exposure light; and a deformation measuring device which is associated with the protection member and measures deformation of the protection member.

According to another aspect of the invention, there is provided an exposure method comprising the steps of accommodating a mask on which a protection member is provided via a frame into a closed chamber having at least one of a first space including an optical path of exposure light and a second space adjacent to said first space; replacing a gas in a space formed between the protection member and the mask with a predetermined gas in the closed chamber; and irradiating the exposure light onto the mask after the latter gas replacement and transferring an image of a pattern of the mask onto a substrate.

According to the exposure method of the invention, with the mask accommodated in the preliminary chamber, the exhaust amount of the gas from the preliminary chamber can be adjusted based on a change in the pressure in the preliminary chamber at the time of replacing a gas in the space formed between the protection member and the mask with a replacement gas by replacing the gas in the preliminary chamber with the replacement gas. In this case, it is also possible to ensure stable gas replacement while preventing the protection member from being damaged, by adjusting the exhaust amount of the gas from the preliminary chamber so that the deformation of the protection member is within the predetermined range. As the mask is placed in the space that includes the optical path with a light absorptive substance in this space reduced, therefore, stable exposure is carried out.

This exposure method can be realized by an exposure apparatus which comprises a closed chamber which accommodates a mask on which a protection member is provided via a frame, the closed chamber having at least one of a first space including an optical path of exposure light and a second space adjacent to said first space; a gas replacement apparatus which is provided with the closed chamber and replaces a gas in the closed chamber with a predetermined gas which demonstrates low absorption of the exposure light; a pressure measuring device which is provided with the closed chamber and measures a pressure in the closed chamber; and a control device which is connected to the pressure measuring device and controls the gas replacement apparatus based on the result of measurement from the pressure measuring device so that the deformation of the protection member is within a predetermined range.

The exposure apparatus of the invention may be modified to comprise a closed chamber which accommodates a mask on which a protection member is provided via a frame, the closed chamber having at least one of a first space including an optical path of exposure light and a second space adjacent to said first space; a gas replacement apparatus which is provided with the closed chamber and replaces a gas in a space formed between the protection member and the mask with a predetermined gas which demonstrates low absorption of the exposure light; and a deformation measuring device which is associated with the protection member and measures deformation of the protection member.

BRIEF DESCRIPTION OF THE DRAWINGS

FIG. 8 is a flowchart illustrating one example of a fabrication process for semiconductor devices.

DETAILED DESCRIPTION OF THE PREFERRED EMBODIMENTS

Figure 1:
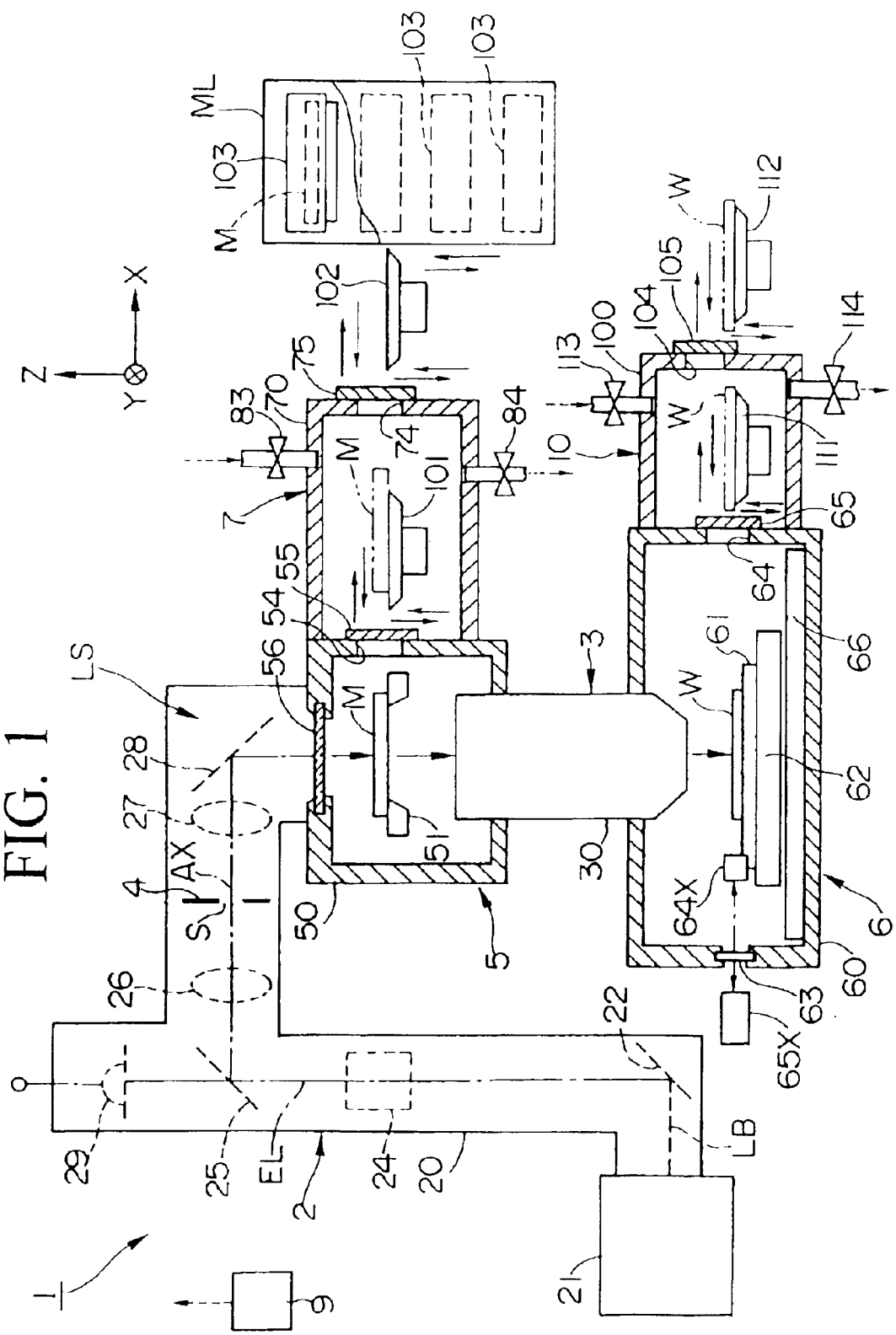
FIG. 1 is a structural diagram illustrating one embodiment of an exposure apparatus equipped with a gas replacement apparatus of the present invention.
Figure 2A:
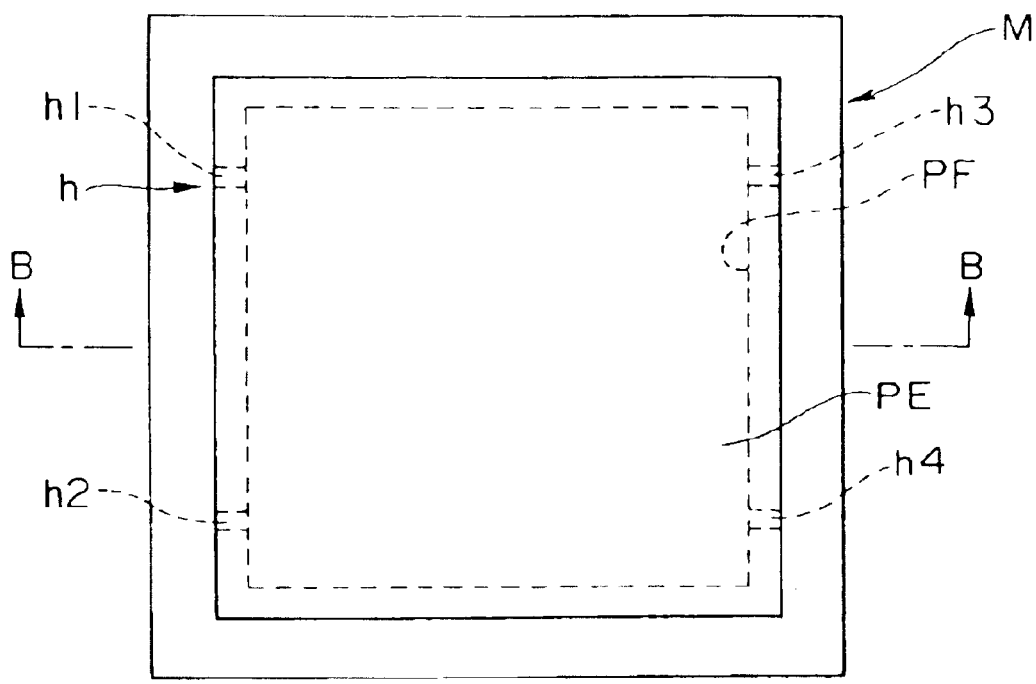
FIGS. 2A and 2B are diagrams for explaining a substrate with which a thin film is placed.
Figure 2B:
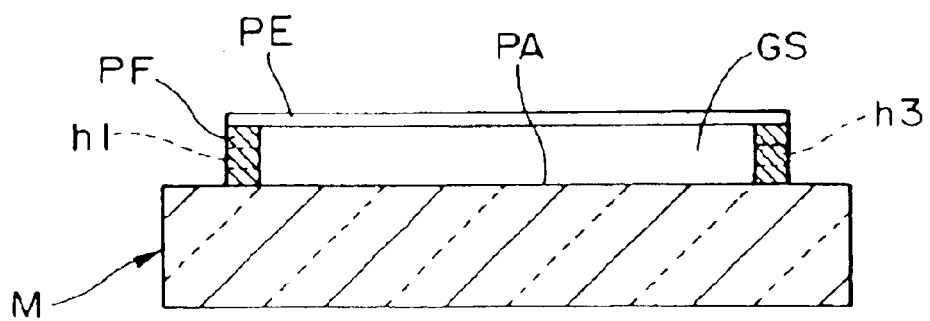
Figure 3:
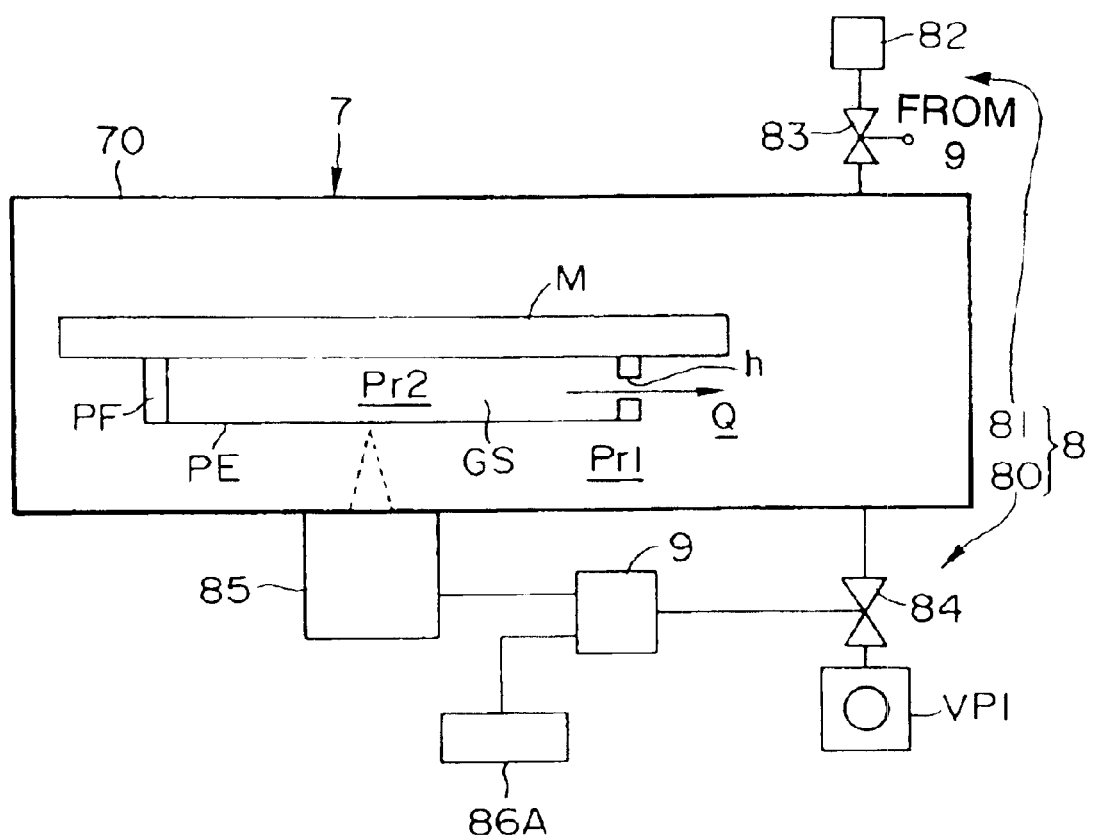
FIG. 3 is a diagram for explaining a first embodiment of the gas replacement apparatus of the invention.

A gas replacement method and apparatus and an exposure method and apparatus according to the first embodiment of the invention will now be described with reference to the accompanying drawings. FIG. 1 is a schematic structural diagram of an exposure apparatus 1 equipped with the gas replacement apparatus of the invention. FIGS. 2A and 2B are diagrams for explaining a mask (substrate) M on which a pellicle (thin film) PE is placed. FIG. 3 is a structural diagram for explaining the gas replacement apparatus provided in a preliminary chamber 7.

The exposure apparatus 1 irradiates illumination light for exposure (exposure light) EL having vacuum ultraviolet rays onto the mask M to transfer the image of the mask M onto a substrate (wafer) W via a projection optical system 3.

Referring to FIGS. 1 through 3, the exposure apparatus 1 comprises an illumination optical system 2 which illuminates the mask M with a luminous flux (light beam) LB from a light source 21, a blind section 4 which defines the illumination area on the mask M by the exposure light EL, a mask chamber 5 which accommodates the mask M, the projection optical system 3 which projects the image of the pattern of the mask M, illuminated with the exposure light EL, onto the substrate (wafer) W, a wafer chamber 6 which accommodates the wafer W, a mask-gas replacement chamber (preliminary chamber) 7 adjacent to the mask chamber 5 and having a different space from an optical path space LS of the exposure light EL, a wafer-gas replacement chamber 10 adjoining the wafer chamber 6, a gas replacement apparatus (not shown) which replaces the gas in the space LS on the optical path of the exposure light EL, and a control section (control system) 9 which controls the general operation of the exposure apparatus 1. The exposure apparatus 1 further comprises a transfer system for the mask M and a transfer system for the wafer W.

The light source 21 emits exposure light of vacuum ultraviolet rays having a wavelength of approximately 120 nm to 180 nm onto the illumination optical system 2. The light source 21 may be selected from a fluorine laser ($F_2$ laser) of an oscillation wavelength of 157 nm, a krypton dimer laser ($Kr_2$ laser) of an oscillation wavelength of 146 nm, an argon dimer laser ($Ar_2$ laser) of an oscillation wavelength of 126 nm and so forth. An ArF excimer laser of an oscillation wavelength of 193 nm or the like may also be used as the light source 21.

The illumination optical system 2 has an optical integrator 24 (which may be a rod lens type or a fly-eye lens as well), a half mirror 25 and a reflector 28. The optical integrator 24 converts the luminous flux (light beam) LB, which has been emitted from the light source 21 and guided by a reflector 22, to the exposure light EL with a nearly uniform illumination distribution. The half mirror 25 guides most of the exposure light EL (e.g., 97%) to the blind section 4 via a lens system 26 and guides the remaining portion (e.g., 3%) to an amount of light monitor 29. The reflector 28 guides the exposure light EL whose illumination area has been defined by the blind section 4 and which has passed a lens system 27 to the mask M. Those optical members and the blind section 4 are arranged inside an illumination-system housing 20, which is a closed space, in a predetermined relationship. In this case, the blind section 4 is located on a surface conjugate to the pattern surface of the mask M.

The amount of light monitor 29, which is comprised of a photoelectric converting element, photoelectrically converts a part of the exposure light EL guided by the half mirror 25 to an electric signal and supplies the electric signal to the control section 9. That is, the control section 9 activates or deactivates the light source 21 based on information from the amount of light monitor 29, thereby controlling the amount of exposure (the amount of illumination of the exposure light) to the wafer W.

The blind section 4 has a pair of blades bent in, for example, a two-dimensional L shape and a moving device which moves the blades within a plane perpendicular to the optical axis, AX, of the exposure light EL based on an instruction from the control section 9. The pair of blades form a rectangular opening S as they are combined within the plane perpendicular to the optical axis AX. The size of the opening S changes as the blades move. The opening S allows only the passed portion of the exposure light EL coming from the optical integrator 24 to the lens system 27. The exposure light EL that has been defined by the opening S illuminates a predetermined area of the mask M placed in the mask chamber 5 with an approximately uniform illuminance via the lens system 27.

The mask chamber 5 has a mask holder 51 which holds the mask M by vacuum chucking. The mask chamber 5 is covered with a partition 50 which is seamlessly connected to the illumination-system housing 20 and a projection-system housing 30 of the projection optical system 3. Formed in a side portion of the partition 50 is an opening portion 54 through which the mask M is loaded in and unloaded. A door 55 which opens or closes in response to an instruction from the control section 9 is provided at the opening portion 54. As the door 55 is closed, the mask chamber 5 is sealed.

The mask holder 51 has an opening corresponding to a pattern area where a pattern on the mask M is formed and is slightly movable in the X direction, Y direction and θ direction (the rotational direction about the Z axis) by an unillustrated drive mechanism. This structure can allow the mask M to be positioned so that the center of the pattern area passes the optical axis AX of the projection optical system 3. The drive mechanism for the mask holder 51 is constituted by, for example using two sets of voice coil motors.

In the top portion of the partition 50 of the mask chamber 5, a transmission window 56 which separates the internal space of the illumination-system housing 20 from the internal space of the mask chamber 5 where the mask M is to be placed is provided. Because the transmission window 56 is positioned on the optical path of the exposure light EL that is illuminated on the mask M by the illumination optical system 2, it is made of a crystal material having a high transmittance to the exposure light EL or vacuum ultraviolet rays, such as fluorite.

The projection optical system 3 forms the image of the pattern of the mask M, located in the illumination area of the exposure light EL defined by the opening S, on the wafer W and exposes the image of the pattern on a predetermined area (shot area) of the wafer W. The projection optical system 3 has a plurality of optical members, such as a lens, formed of a fluoride crystal, such as fluorite or lithium fluoride, and a reflector, sealed by the projection-system housing 30. In this embodiment, a reduction optical system having a projection magnification of, for example, ¼ or ⅕, is used as the projection optical system 3. Accordingly, the projection optical system 3 performs reduced projection of the pattern formed on the mask M onto a shot area on the wafer W, so that the reduced image of the pattern is transferred on the wafer W.

The individual optical members of the projection optical system 3 are supported on the projection-system housing 30 by respective holding members. Each holding member is provided in a ring shape so as to hold the peripheral portion of the associated optical member. A closed space is formed between each optical member and the partition 50 of the mask chamber 5. At this time, the holding members are tilted with respect to the optical axis AX so as to avoid the gas accumulation or are constructed so that their surfaces approximately coincide with the surfaces of the associated optical members. The gas therefore smoothly flows in each space.

The wafer chamber 6 has a wafer holder 61 which holds the wafer W by vacuum chucking. The wafer chamber 6 is covered with a partition 60 which is seamlessly connected to the projection-system housing 30. Formed in a side portion of the partition 60 is an opening portion 64 through which the wafer W is loaded in and unloaded. A door 65 which opens or closes in response to an instruction from the control section 9 is provided at the opening portion 64. As the door 65 is closed, the wafer chamber 6 is sealed.

The wafer holder 61 is supported on a wafer stage 62. The wafer stage 62 is a pair of stacked blocks movable in the perpendicular directions. The wafer stage 62 is movable in the horizontal direction along the X-Y plane. Alternatively, the wafer stage 62 may be freely driven in the X-Y plane along the top surface of a base 66 or in a non-contact fashion by a wafer drive system (not shown). In other words, the wafer W fixed on the wafer stage 62 is movable in the horizontal direction along the X-Y plane (the direction perpendicular to the optical axis AX of the projection optical system 3).

The position of the wafer stage 62 is adjusted by a laser interferometer system. This will be discussed more specifically. A light transmission window 63 is provided in the −X-side wall of the partition 60 of the wafer chamber 6. Likewise, a light transmission window is provided in the +Y-side wall of the partition 60 (the depth side on the sheet of paper in FIG. 1). Each of those light transmission windows is constituted by attaching a light transparent member which closes a window portion (opening portion) formed in the partition 60, a typical optical glass in this example, to this window portion. In this case, the attaching portion is sealed with a metal seal of indium, copper or the like, or with a fluorine-based resin in order to avoid gas leakage from the portion where the light transparent member constituting the light transmission window 63 is attached.

An X-directionally movable mirror 64X made of a plane mirror extends in the X direction from the −X-side end of the wafer holder 61. A length-measuring beam from an X-axis laser interferometer 65X located outside the wafer chamber 6 is projected onto the X-directionally movable mirror 64X nearly perpendicularly via the light transmission window 63. The reflected light of the length-measuring beam is received by a detector in the X-axis laser interferometer 65X via the light transmission window 63, so that the position of the X-directionally movable mirror 64X or the X position of the wafer W is detected with a reference mirror in the X-axis laser interferometer 65X taken as a reference position.

Likewise, though not illustrated, a Y-directionally movable mirror made of a plane mirror extends in the Y direction from the +Y-side end of the wafer holder 61. The position of the Y-directionally movable mirror, i.e., the Y position of the wafer W is detected in the same manner as mentioned above by a Y-axis laser interferometer via the Y-directionally movable mirror. The values detected (or measured) by the laser interferometers of the X and Y axes are supplied to the control section 9. The control section 9 controls the positioning of the wafer stage 62 while monitoring the detected values from the laser interferometers at the time of stepping between shot areas.

At this time, the laser interferometers of the X and Y axes, i.e., the optical members and detectors, such as laser light sources and prisms, are located outside the wafer chamber 6. Even if a slight amount of a light absorptive substance is produced from the detectors, etc. that constitute the laser interferometers, it does not adversely affect exposure.

If the production of a light absorptive substance from the components of each laser interferometer is suppressed, those components may be arranged in the wafer chamber 6.

In the exposure apparatus 1 of the embodiment, the control section 9 repeats a stepping operation of moving the wafer stage 62 so that the individual shot areas on the wafer W are sequentially positioned at the exposure position and an exposure operation of transferring the image of a pattern formed on the mask M by illuminating the exposure light EL on the mask M with the positioning done, thereby transferring the image of the pattern, formed on the mask M, on the shot areas on the wafer W.

The internal spaces (closed spaces) that are formed between the illumination-system housing 20 of the illumination optical system 2 and the mask chamber 5 and between the projection-system housing 30 of the projection optical system 3 and the wafer chamber 6 prevent the gases coming from outside and prevent the internal gases from leaving from internal spaces. Those internal spaces become the optical path space LS for the exposure light EL that has been emitted from the light source 21 and are to be irradiated on the wafer W.

The preliminary chamber (mask-gas replacement chamber) 7 is provided adjacent to the mask chamber 5 and has a closed space independent of and different from the optical path space LS of the exposure light EL. The mask-gas replacement chamber 7 is covered with a partition 70 seamlessly connected to the partition 50 of the mask chamber 5. The partition 70 is provided on that side where the opening portion 54 of the partition 50 of the mask chamber 5 is located. The mask chamber 5 and the mask-gas replacement chamber 7 communicate with each other through the opening portion 54.

An opening portion 74 is formed on the side wall of the partition 70 of the mask-gas replacement chamber 7 which is opposite to the side connected to the mask chamber 5 (or on the +X side). A door 75 which opens or closes in response to an instruction from the control section 9 is provided at the opening portion 74. As the doors 55 and 75 are closed, the mask-gas replacement chamber 7 is sealed.

Arranged inside the mask-gas replacement chamber 7 is a mask loader 101 as a first mask transfer system which is comprised of a robot arm for loading and unloading the mask M in and out of the mask chamber 5 via the opening portion 54. Provided outside the door 75 is a mask transfer mechanism 102 as a second mask transfer system which is comprised of a robot arm for loading and unloading the mask M in and out of the mask-gas replacement chamber 7 via the opening portion 74. A mask library ML has a plurality of shelves on each of which a mask case 103 accommodating the mask M is stored. The mask loader 101 and the mask transfer mechanism 102 are connected to the control section 9 and operate based on an instruction from the control section 9.

The wafer-gas replacement chamber 10 is provided adjacent to the wafer chamber 6. The wafer-gas replacement chamber 10 has a closed space independent of and different from the optical path space LS of the exposure light EL. The mask-gas replacement chamber 7 is covered with a partition 100 seamlessly connected to the partition 60 of the wafer chamber 6. The partition 100 is provided on that side where the opening portion 64 of the partition 60 of the wafer chamber 6 is located. The wafer chamber 6 and the wafer-gas replacement chamber 10 communicate with each other through the opening portion 64.

An opening portion 104 is formed on the side wall of the partition 100 of the wafer-gas replacement chamber 10 which is opposite to the side connected to the wafer chamber 6 (or on the +X side). A door 105 which opens or closes in response to an instruction from the control section 9 is provided at the opening portion 104. As the doors 65 and 105 are closed, the wafer-gas replacement chamber 10 is sealed.

Arranged inside the wafer-gas replacement chamber 10 is a wafer loader 111 as a first substrate transfer system which is comprised of a robot arm for loading and unloading the wafer W in and out of the wafer chamber 6 via the opening portion 104. Provided outside the door 105 is a wafer transfer mechanism 112 as a second substrate transfer system which is comprised of a robot arm for loading and unloading the wafer W in and out of the wafer-gas replacement chamber 10 via the opening portion 104. The wafer loader 111 and the wafer transfer mechanism 112 are conned to the control section 9 and operate based on an instruction from the control section 9.

As shown in FIGS. 2A and 2B, the mask M has a pellicle (thin film) PE provided therewith as a protection member. FIG. 2A is a plan view of the mask M with a pattern surface PA at the top surface, and FIG. 2B is a cross-sectional diagram taken along the B—B line in FIG. 2A. The pellicle PE is adhered to the pattern surface PA of the mask M via a metal frame PF called pellicle frame (or pellicle stand). A transparent thin film of about 1 to 2 $\mu$m thick, whose essential component is nitrocellulose or the like is used as the pellicle PE. To well pass the exposure light EL of vacuum ultraviolet rays having a wavelength of 120 nm to 180 nm, a film-like member formed of a crystal material, such as fluorite which is the same material for the mask M and the lens systems, magnesium fluoride or lithium fluoride, may be used as well. Also available as the pellicle (thin film) PE is a quartz glass (fluorine-doped quartz or the like) having a thickness of, for example, about 100 to 300 $\mu$m.

Formed between the pellicle PE and the pattern surface PA is a space GS which is to be filled with a predetermined amount of gas as shown in FIG. 2B. Formed on the metal frame PF are ventilation holes h (h1, h2, h3, h4) to prevent the pellicle PE from being broken by a change in atmospheric pressure. When the atmospheric pressure drops and the gas in the space GS expands due to transportation by aircraft, a change in weather or the like, for example, the ventilation holes h reduce the sealing ability of the space GS to thereby prevent the pellicle PE from being damaged.

When light whose wavelength lies in the range of vacuum ultraviolet rays is used as the exposure light EL, it is necessary to decrease the concentration of a gas having high absorption characteristic with respect to light of that wavelength band (hereinafter called "light absorptive substance"), such as oxygen, vapor or hydrocarbon-based gas, in the optical path space LS. Therefore, the unillustrated gas replacement apparatus subjects the optical path space LS to a work of reducing the concentration of the light absorptive substance present in the optical path space LS. That is, the light absorptive substance present in the optical path space LS is changed to (replaced with) a gas which shows low absorption characteristic with respect to the light of vacuum ultraviolet range, such as nitrogen, helium, argon, neon or krypton, or a gas mixture thereof (hereinafter called "low-light absorptive substance" or "predetermined gas"). The concentration of the light absorptive substance present in the optical path space LS may also be reduced by decreasing the pressure in the optical path space LS, instead of replacing the gas in the optical path space LS with a predetermined gas, while acquiring the same effect as obtained by the gas replacement scheme.

After the mask M is transferred into the optical path space LS (in the mask chamber 5) from outside and loaded on the mask holder 51, exposure light is irradiated on the mask M, thereby transferring the image of the pattern formed on the mask M onto each shot area of the wafer W. After the image transfer, the mask M is moved out of the apparatus again. At the time of loading the mask M in and out, the outside air (atmosphere) may enter the mask chamber 5. As the outside air contains a light absorptive substance such as oxygen, it absorbs the exposure light EL considerably, which may result in an unallowable reduction or variation in transmittance.

To prevent the outside air from entering the mask chamber 5, therefore, the mask M is temporarily accommodated in the mask-gas replacement chamber 7 adjoining the mask chamber 5 before mask loading into the mask chamber 5, the concentrations of the light absorptive substances in the mask chamber 5 and the mask-gas replacement chamber 7 are reduced by the unillustrated gas replacement apparatus, then the mask M is load into the mask chamber 5 from the mask-gas replacement chamber 7.

Likewise, to prevent the outside air from entering the wafer chamber 6, the wafer W is temporarily accommodated in the wafer-gas replacement chamber 10 adjoining the wafer chamber 6 before wafer loading into the wafer chamber 6, the concentrations of the light absorptive substances in the wafer chamber 6 and the wafer-gas replacement chamber 10 are reduced by the unillustrated gas replacement apparatus, then the wafer W is fed into the wafer chamber 6 from the wafer-gas replacement chamber 10.

The gas replacement apparatus has an exhaust device which exhausts a gas from each of the aforementioned chambers and a gas supply device which supplies a predetermined gas (replacement gas) into each chamber. The supply amount and exhaust amount of those exhaust device and gas supply device are regulated based on an instruction from the control section 9.

An air filter and a chemical filter may be provided in a predetermined-gas intake pipe connected to each of the chambers 20, 5, 30, 6, 7 and 10 and an exhaust pipe for the gas in each chamber (light absorptive substances or gas mixtures of light absorptive substances and a predetermined gas) to circulate the gases in the individual chambers. In this case, because most of an organic substance contained in the gas to be circulated is removed, the predetermined gas if circulated over a long period of time hardly affect exposure. The organic substance contains a substance which constitutes each chamber or an outer gas which is generated from wires present in each chamber.

A gas replacement apparatus 8 to be connected to the mask-gas replacement chamber (preliminary chamber) 7 will be discussed more specifically with reference to FIG. 3.

The mask-gas replacement chamber 7 is provided to prevent the air from entering the mask chamber 5 at the time the mask M is loaded in and loaded out. The concentration of the light absorptive substance in the space GS is reduced before the mask M with the pellicle PE mounted thereon is loaded into the mask chamber 5 or the optical path space LS. It is thereby possible to further prevent the air from entering the optical path space LS or absorption of the exposure light in the space GS to be formed between the pellicle PE and the mask M in the mask-gas replacement chamber 7.

In this case, as the gas in the mask-gas replacement chamber 7 is replaced with the predetermined gas, the gas in the space GS formed between the pellicle PE and the mask M (the gas in the space GS means air or atmosphere in the clean room) is replaced with the predetermined gas through the ventilation holes h that are formed in the metal frame PF and communicate with the space GS. At this time, the exhausting and gas supplying operations that take place in the gas replacement in the mask-gas replacement chamber 7 cause a pressure change in the mask-gas replacement chamber 7. The pressure change displaces the pellicle PE.

The gas replacement apparatus 8 connected to the mask-gas replacement chamber 7 has an exhaust device 80, which exhausts the gas from the mask-gas replacement chamber 7 where the mask M with the pellicle PE mounted thereon is accommodated, a deformation measuring device 85, which measures the exhaust-originated deformation of the pellicle PE, and the control section 9 which regulates the exhaust amount of the gas from the mask-gas replacement chamber 7 based on the result of the measurement made by the deformation measuring device 85 so that the deformation of the pellicle PE is within a predetermined range. The exhaust device 80 has an exhaust pipe which communicates with the interior of the mask-gas replacement chamber 7, an exhaust pump VP1 which exhausts the gas from the mask-gas replacement chamber 7 via the exhaust pipe, and an exhaust valve 84 disposed in the exhaust pipe.

The gas replacement apparatus 8 also includes a gas supply device 81 which supplies the predetermined gas into the mask-gas replacement chamber 7. The control section 9 adjusts the amount of the gas supplied by the gas supply device 81 so that the deformation of the pellicle PE is within a predetermined range. The gas supply device 81 has an intake pipe which communicates with the interior of the mask-gas replacement chamber 7 and an intake valve 83 disposed in this intake pipe.

The deformation measuring device 85, which measures the deformation of the pellicle PE, is provided on the partition 70 of the mask-gas replacement chamber 7. Available as the deformation measuring device 85 are various deformation sensors including a laser displacement sensor. When a laser displacement sensor is used, for instance, the projected light from the deformation measuring device 85 is reflected at the pellicle PE and is received by the detector. The deformation measuring device 85 may be placed in the partition 70 of the mask-gas replacement chamber 7. The output signal of the deformation measuring device 85 is sent to the control section 9.

The measuring target of the deformation measuring device 85 is the center area of the pellicle PE (i.e., the area that is apart from the peripheral area attached to the metal frame PF and has a large amount of displacement with respect to the peripheral area).

Connected to the control section 9 is a memory device 86A where information about the deformation of the pellicle PE is stored. This information is data on the deformation small enough not to damage the pellicle PE. That is, the memory device 86A prestores the deformation range (predetermined range) in which the pellicle PE does not break. The pellicle PE is so set as not to break within this predetermined range. The predetermined range of the deformation of the pellicle PE can be acquired beforehand through experiments.

The control section 9 compares the result of the measurement from the deformation measuring device 85 with the deformation information stored in the memory device 86A, and controls the opening/closing of the exhaust valve 84, the activation/deactivation of the exhaust pump VP1, the opening/closing of the intake valve 83 and the activation/deactivation of an intake pump P5.

A description will now be given of an exposure method of irradiating the exposure light EL on the mask M with the pellicle PE mounted thereon via the metal frame PF to thereby transfer the image of the pattern of the mask M on the wafer W by using the exposure apparatus 1 equipped with the gas replacement apparatus 8 having the above-described structure.

The exposure method of the embodiment comprises a step of reducing a light absorptive substance in the optical path space LS by means of the gas replacement apparatus prior to an exposure step, a step of respectively loading the mask M and wafer W into the mask-gas replacement chamber 7 and the wafer-gas replacement chamber 10, both provided to prevent the air from entering the optical path space LS, from outside, a step of reducing light absorptive substances in the mask-gas replacement chamber 7 and the wafer-gas replacement chamber 10 which respectively accommodate the mask M and the wafer W, a step of respectively loading the mask M and the wafer W from the mask-gas replacement chamber 7 and the wafer-gas replacement chamber 10 into the mask chamber 5 and the wafer chamber 6, the exposure step of transferring the image of the pattern of the mask M on the wafer W, and a step of unloading the mask M or the wafer W, undergone the exposure step, out of the exposure apparatus 1.

First, the control section 9 controls the exhaust device which exhausts the gas in each chamber and the gas supply device which supplies the predetermined gas into each chamber, thereby reducing the light absorptive substance in the optical path space LS. That is, the light absorptive substances in the illumination-system housing 20, the mask chamber 5, the projection-system housing 30 and the wafer chamber 6 are reduced. At this time, the amount of the predetermined gas to be supplied from the gas supply device is control so that the pressure in each chamber becomes slightly higher than the atmospheric pressure, specifically by about 1 to 10%. Making the pressure in each chamber higher than the atmospheric pressure by about 1 to 10% can prevent the outside air from entering (or the air from leaking).

The light absorptive substances in the illumination-system housing 20, the mask chamber 5, the projection-system housing 30 and the wafer chamber 6 are reduced by a scheme similar to the above-described one.

The operation at the time of loading the mask M into the exposure apparatus 1 will be discussed below.

First, the control section 9 takes out the mask M, accommodated in the mask case 103 and stored in the mask library ML, from the mask case 103 in the mask library ML by means of the mask transfer mechanism 102. The mask transfer mechanism 102 transfers the mask M toward the mask-gas replacement chamber 7 based on an instruction from the control section 9. When the mask transfer mechanism 102 holding the mask M comes within a predetermined distance from the mask-gas replacement chamber 7, the control section 9 opens the door 75. At this time, the opening portion 54 or the boundary between the mask-gas replacement chamber 7 and the mask chamber 5 is closed by the door 55.

Next, the control section 9 causes the mask transfer mechanism 102 holding the mask M to enter the mask-gas replacement chamber 7 through the opening portion 74 and transfers the mask M from the mask transfer mechanism 102 to the mask loader 101.

At the time the mask transfer mechanism 102 enters the mask-gas replacement chamber 7, the outside door 75 is opened to let the outside air enter the mask-gas replacement chamber 7. As the inside door 55 is closed, however, the light absorptive substance such as oxygen contained in the outside air does not enter the mask chamber 5 (optical path space LS).

After the mask M is transferred to the mask loader 101, the control section 9 causes the mask transfer mechanism 102 to move out of the mask-gas replacement chamber 7 through the opening portion 74, then closes the door 75.

As the door 75 is closed, the mask chamber 5 becomes a closed space. That is, the mask M with the pellicle PE mounted thereon is accommodated in the mask-gas replacement chamber 7 or closed chamber. The control section 9 uses the exhaust device 80 to exhaust the gas from the mask-gas replacement chamber 7 accommodating the mask M with the pellicle PE mounted thereon. Specifically, the control section 9 opens the exhaust valve 84 and activates the exhaust pump VP1 to start reducing the pressure in the mask-gas replacement chamber 7.

As the pressure is lowered by exhausting the gas from the mask-gas replacement chamber 7, the gas in the space GS formed between the pellicle PE and the mask M is exhausted from the ventilation holes h in the metal frame PF (only one shown in FIG. 3). As the diameter of the ventilation holes h is small, there is not much gas exhausted outside (into the mask-gas replacement chamber 7) from the space GS. That is, the difference between the exhaust amount of the gas from the space GS and the exhaust amount of the gas from the mask-gas replacement chamber 7 produces a difference between pressure Pr1 in the mask-gas replacement chamber 7 and pressure Pr2 in the space GS.

This pressure difference displaces the pellicle PE. The deformation of the pellicle PE is measured by the deformation measuring device 85. The output of the deformation measuring device 85 is sent to the control section 9. The control section 9 controls the exhaust device 80 to adjust the exhaust amount of the gas from the mask-gas replacement chamber 7 so that the deformation of the pellicle PE is within a predetermined range. Specifically, the control section 9 compares the result of the measurement from the deformation measuring device 85 with the information about the deformation of the pellicle PE (predetermined range) stored in the memory device 86A and adjusts the opening/closing of the exhaust valve 84 and the output of the exhaust pump VP1 so that the deformation of the pellicle PE does not become equal to or greater than the predetermined range.

In this case, when the deformation of the pellicle PE is smaller than the predetermined range, the control section 9 instructs the exhaust device 80 to increase the exhaust amount of the gas from the mask-gas replacement chamber 7. When the deformation of the pellicle PE is greater than the predetermined range or is just before exceeding it, the control section 9 instructs the exhaust device 80 to reduce the exhaust amount of the gas.

The control section 9 monitors the output of a pressure sensor provided in the mask-gas replacement chamber 7 while measuring the deformation of the pellicle PE using the deformation measuring device 85. When the pressure in the mask-gas replacement chamber 7 falls to, for example, about 0.1 Pa, the control section 9 closes the exhaust valve 84 and stops the exhaust pump VP1.

Next, the control section 9 supplies the predetermined gas into the depressurized mask-gas replacement chamber 7 using the gas supply device 81. Specifically, the control section 9 opens the intake valve 83 and activates the intake pump P5. As a result, the supply of the low light absorptive substance (predetermined gas) into the mask-gas replacement chamber 7 from a gas supplying device 82 is initiated.

As the predetermined gas is supplied into the mask-gas replacement chamber 7, the predetermined gas is accordingly supplied into the space GS formed between the pellicle PE and the mask M through the ventilation holes h that communicate with the space GS. As the diameter of the ventilation holes h is small, there is a small amount of the predetermined gas flowing into the space GS from outside (inside the mask-gas replacement chamber 7). That is, the difference between the supply amount of the predetermined gas into the space GS and the supply amount of the gas into the mask-gas replacement chamber 7 produces a difference between the pressure Pr1 in the mask-gas replacement chamber 7 and the pressure Pr2 in the space GS.

This pressure difference deforms the pellicle PE. The deformation of the pellicle PE is measured by the deformation measuring device 85. The output of the deformation measuring device 85 is sent to the control section 9. The control section 9 controls the gas supply device 81 to adjust the supply amount of the predetermined gas into the mask-gas replacement chamber 7 so that the deformation of the pellicle PE is within a predetermined range. Specifically, the control section 9 compares the result of the measurement made by the deformation measuring device 85 with the information about the deformation of the pellicle PE (predetermined range) stored in the memory device 86A and adjusts the opening/closing of the intake valve 83 and the output of the intake pump P5 so that the deformation of the pellicle PE does not become equal to or greater than the predetermined range.

In this case, when the deformation of the pellicle PE is smaller than the predetermined range, the control section 9 instructs the gas supply device 81 to increase the supply amount of the predetermined gas into the mask-gas replacement chamber 7. When the deformation of the pellicle PE is greater than the predetermined range or is just before exceeding it, the control section 9 instructs the gas supply device 81 to reduce the supply amount of the gas.

After the supply of the predetermined gas starts, the control section 9 closes the intake valve 83 and stops the intake pump P5 when the output of the pressure sensor provided in the mask-gas replacement chamber 7 indicates that the internal pressure becomes slightly higher than the atmospheric pressure. As a result, the gas in the space GS formed between the pellicle PE and the mask M and the gas in the mask-gas replacement chamber 7 are replaced with the predetermined gas.

After the gas in the mask-gas replacement chamber 7 is replaced with the predetermined gas, the control section 9 opens the door 55 and loads the mask M onto the mask holder 51 in the mask chamber 5 using the mask loader 101. Then, the control section 9 returns the mask loader 101 into the mask-gas replacement chamber 7 through the opening portion 54 and closes the door 55.

A description will now be given of the operation of loading the wafer W into the exposure apparatus 1.

The control section 9 performs pre-alignment (positioning) of the wafer W that has been loaded into the exposure apparatus from outside by an unillustrated substrate pre-alignment equipment. The control section 9 uses the wafer transfer mechanism 112 to transfer the pre-aligned wafer W to the wafer-gas replacement chamber 10. When the wafer transfer mechanism 112 holding the wafer W comes within a predetermined distance from the wafer-gas replacement chamber 10, the control section 9 opens the door 105. At this time, the opening portion 64 or the boundary between the wafer-gas replacement chamber 10 and the wafer chamber 6 is closed by the door 65.

Next, the control section 9 causes the wafer transfer mechanism 112 holding the wafer W to enter the wafer-gas replacement chamber 10 through the opening portion 104 and transfers the wafer W from the wafer transfer mechanism 112 to the wafer loader 111.

At the time the wafer transfer mechanism 112 enters the wafer-gas replacement chamber 10, the outside door 105 is opened to let the outside air enter the wafer-gas replacement chamber 10. As the inside door 65 is closed, however, the light absorptive substance such as oxygen contained in the outside air does not enter the wafer chamber 6 (optical path space LS).

After the wafer W is transferred to the wafer loader 111, the control section 9 causes the wafer transfer mechanism 112 to move out of the wafer-gas replacement chamber 10 through the opening portion 104, then closes the door 105.

Next, the control section 9 opens an exhaust valve 114 and activates an unillustrated exhaust pump to start reducing the pressure in the wafer-gas replacement chamber 10. The control section 9 monitors the output of a pressure sensor provided in the wafer-gas replacement chamber 10. When the pressure in the wafer-gas replacement chamber 10 falls to, for example, about 0.1 Pa, the control section 9 closes the exhaust valve 114 and stops the exhaust pump.

The pressure reduction removes the light absorptive substance such as oxygen from the wafer-gas replacement chamber 10. As the pressure in the wafer-gas replacement chamber 10 is lowered, if there is moisture on the top surface or the bottom surface of the wafer W when the wafer W is loaded into the wafer-gas replacement chamber 10, the pressure reduction removes the most of the moisture from the wafer W. This can prevent moisture stuck on the wafer W from contaminating the inside of the wafer chamber 6. It is therefore possible to prevent the undesirable occurrence of the event such that the layer of moisture on the surface of the wafer W intensely absorbs the exposure light and is decomposed, thus increasing the required exposure light, which makes the real exposure amount unstable.

Next, the control section 9 opens an intake valve 113. This starts the supply of the low light absorptive substance (predetermined gas) into the wafer-gas replacement chamber 10 from the gas supplying device 82. After the supply of the predetermined gas starts, the control section 9 closes the intake valve 113 when the output of the pressure sensor provided in the wafer-gas replacement chamber 10 indicates that the internal pressure becomes the aforementioned predetermined target pressure.

Thereafter, the control section 9 opens the door 65 and loads the wafer W onto the wafer holder 61 in the wafer chamber 6 using the wafer loader 111. Then, the control section 9 returns the wafer loader 111 into the wafer-gas replacement chamber 10 through the opening portion 64 and closes the door 65.

Then comes an exposure process of irradiating the exposure light EL on the mask M held on the mask holder 51 to thereby transfer the image of the pattern formed on the mask M onto the wafer W held on the wafer holder 61.

After the exposure of the wafer W is completed, the control section 9 opens the door 65 and moves the wafer loader 111 into the wafer chamber 6 via the opening portion 64 in order to move the exposed wafer W out of the exposure apparatus 1. The control section 9 unloads the wafer W from the wafer holder 61 using the wafer loader 111, returns the wafer loader 111 holding the wafer W into the wafer-gas replacement chamber 10 via the opening portion 64, then closes the door 65.

Next, the control section 9 opens the door 105, causes the wafer transfer mechanism 112 to enter the wafer-gas replacement chamber 10 via the opening portion 104 and transfers the wafer W to the wafer transfer mechanism 112 from wafer loader 111. After the transfer of the wafer W to the wafer transfer mechanism 112 wafer transfer mechanism 112, the control section 9 moves the wafer transfer mechanism 112 holding the wafer W outside the wafer-gas replacement chamber 10 via the opening portion 104 and closes the door 105.

Then, the wafer transfer mechanism 112 transfers the wafer W to an external transfer mechanism which in turn carries the wafer W out of the exposure apparatus 1.

In this embodiment, the predetermined gas fills not only the internal spaces formed in the illumination-system housing 20 of the illumination optical system 2, the mask chamber 5, the projection-system housing 30 of the projection optical system 3 and the wafer chamber 6 but also the space between the pellicle PE and the pattern surface formed on the mask M. Accordingly, the mask M with the pellicle PE mounted thereon is accommodated in the mask-gas replacement chamber 7 or closed chamber and the gas in the space GS formed between the pellicle PE and the mask M is replaced with the predetermined gas in the chamber 7. The light absorptive substance does not therefore enter the optical path space LS of the exposure light from the light source 21 to the wafer W. At the time of replacing the gas in the space GS with the predetermined gas in the mask-gas replacement chamber 7, first, the gas in the mask-gas replacement chamber 7 is exhausted to discharge the gas from the space GS. It is possible to implement stable gas exhaust while preventing the pellicle PE from being damaged by adjusting the exhaust amount of the gas from the mask-gas replacement chamber 7 so that the deformation of the pellicle PE is within a predetermined range. At the time of supplying the predetermined gas into the space GS, likewise, the supply amount of the predetermined gas into the mask-gas replacement chamber 7 is regulated so that the deformation of the pellicle PE is within a predetermined range. This can ensure stable gas replacement while preventing the pellicle PE from being damaged.

In this case, the exhaust amount of the gas from and the supply amount of the gas into the mask-gas replacement chamber 7 are adjusted based on the result of measuring the deformation of the pellicle PE. This can prevent the pellicle PE from being broken. It is possible to implement such control as to increase the exhaust amount or supply amount of the gas when the deformation of the pellicle PE is within a predetermined range, and to reduce the exhaust amount or supply amount of the gas when the deformation of the pellicle PE exceeds the predetermined range. This can shorten the time required to replace the gas in the space GS and can thus ensure efficient and stable gas replacement.

It is also possible to measure the deformation of the pellicle PE and simultaneously execute the exhaust of the gas from the mask-gas replacement chamber 7 and the supply of the predetermined gas into the mask-gas replacement chamber 7 so that the deformation of the pellicle PE is within the predetermined range. In other words, the control section 9 can measure the deformation of the pellicle PE and control both the exhaust device 80 and the gas supply device 81 at the same time so that the deformation of the pellicle PE is within the predetermined range.

A second embodiment of the exposure apparatus equipped with the gas replacement method and apparatus of the invention will be discussed by referring to FIGS. 4A and 4B. To simplify or omit the description of the components of the second embodiment, like or same reference numerals are given to those components which are the same as or correspond to the components of the first embodiment.

Figure 4A:
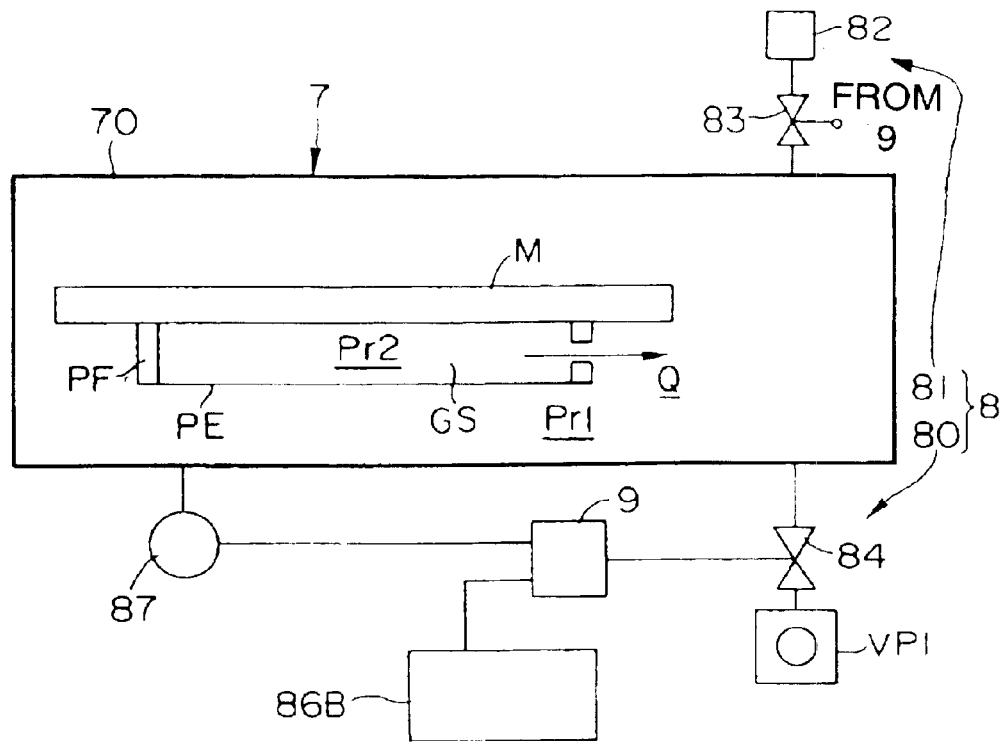
FIGS. 4A and 4B are diagrams for explaining a second embodiment of the gas replacement apparatus of the invention.

Referring to FIG. 4A, provided in the mask-gas replacement chamber (preliminary chamber) 7 which accommodates a mask M with a pellicle PE mounted thereon via the metal frame PF are the exhaust device 80 which exhausts the gas from the mask-gas replacement chamber 7, a pressure sensor (pressure measuring device) 87 which measures the pressure in the mask-gas replacement chamber 7, and the gas supply device 81 which supplies a predetermined gas into the mask-gas replacement chamber 7. The control section 9 is connected to the pressure sensor 87 so that the output signal of the sensor 87 is sent to the control section 9. The control section 9 controls the exhaust device 80 based on the result of the measurement made by the pressure sensor 87.

Also connected to the control section 9 is a memory device 86B where the relationship between a change in pressure in the mask-gas replacement chamber 7 and the deformation of the pellicle PE is prestored. Specifically, the memory device 86B is holding data about the exhaust speed high enough to prevent the pellicle PE from being damaged by a change in pressure which is caused by the exhaust of the gas from the mask-gas replacement chamber 7.

Figure 4B:
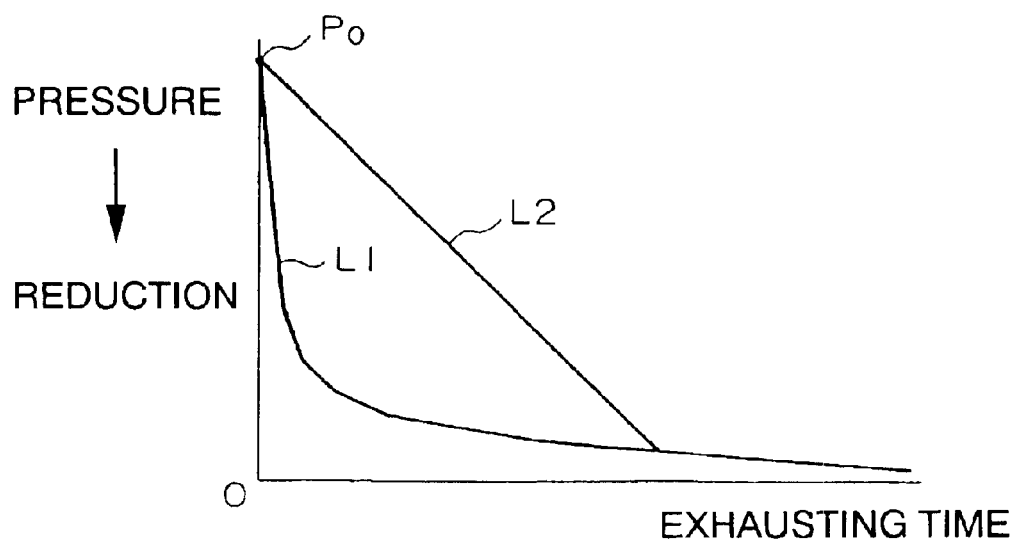

Referring to FIG. 4B, when the exhaust pump VP1 and the exhaust valve 84 are opened simply, the pressure in the wafer chamber 6 rapidly falls immediately after gas exhaust starts as in indicated by a curve L1. This increases the difference between the pressure Pr1 in the mask-gas replacement chamber 7 and the pressure Pr2 in the space GS, which may damage the pellicle PE. As the exhausting process progresses, the exhaust speed becomes lower, making the time needed for the gas exhaust longer.

The vertical scale in the graph shown in FIG. 4B represents the pressures in the mask-gas replacement chamber 7 and the space GS while the horizontal scale shows the exhaust time. When the exhaust time is "0", the pressures in the mask-gas replacement chamber 7 and the space GS become the atmospheric pressure (or 1 atmospheric pressure) P0.

More specifically, at the time of replacing the gas in the space GS, the pressure in the mask-gas replacement chamber 7 is reduced to, for example, about 0.1 Pa first, then the mask-gas replacement chamber 7 is filled with a predetermined gas, thus ensuring efficient gas replacement. In the case of reducing the pressure in the mask-gas replacement chamber 7, when the exhaust pump VP1 is merely driven and the exhaust valve 84 is merely opened, the effective exhaust speed S (the product of the volume of the gas to be exhausted per unit time and the then pressure) can be given as follows using the exhaust speed Sp of the exhaust pump and the conductance C of the exhaust pipe.

$$S=(Sp+C)/Sp \cdot C \quad (1)$$

$$C=kP \cdot d^4/L \quad (2)$$

where k is a parameter based on the characteristic of the exhaust system, d is the diameter of the exhaust pipe, L is the length of the exhaust pipe and P is the average pressure of the exhaust pipe.

In this case, the exhaust amount Q of the gas from the space GS via the ventilation holes can be given as follows.

$$Q=S(Pr2-Pr1) \quad (3)$$

It is apparent from the equations 1 and 2 that at the time of exhausting the gas from the mask-gas replacement chamber 7, the exhaust speed immediately after gas exhaust is started is high but becomes lower as the exhaust progresses and the pressure in the mask-gas replacement chamber 7 gets lower. Therefore, gas exhaust using, for example, a large-diameter exhaust pipe can shorten the exhaust time but may damage the pellicle PE immediately after gas exhaust is started. On the other hand, making the diameter of the exhaust pipe smaller prevents the pellicle PE from being damaged at the price of a longer exhaust time. The long exhaust time results in a lower working efficiency.

In view of the above, immediately after gas exhaust is started, the exhaust speed is set low enough to prevent the pellicle PE from being damaged and the exhaust device 80 is driven to increase the exhaust speed, thus ensuring efficient exhaust, as the exhaust progresses. The memory device 86B therefore stores information about the ideal exhaust speed (the relationship between the exhaust time and a change in pressure) as represented by a curve L2.

The slope of the curve L2 takes a value which can shorten the exhaust time without damaging the pellicle PE and is acquired through experiments. The control section 9 refers to the ideal curve L2 (data table) while detecting the output signal of the pressure sensor 87, and controls the exhaust device 80 to adjust the exhaust amount so that the difference between the output signal of the pressure sensor 87 and the ideal curve L2 becomes substantially zero or is within a predetermined range. Specifically, the control section 9 performs such control as to set the exhaust speed low immediately after gas exhaust is started and increase the exhaust speed as the exhaust progresses. This control can shorten the time needed for gas exhaust while preventing the pellicle PE from being damaged.

Apparent from the above, a change in pressure in the mask-gas replacement chamber 7 is measured by the pressure sensor 87 and the gas in the mask-gas replacement chamber 7 is exhausted by adjusting the exhaust amount based on the result of that measurement so that the deformation of the pellicle PE is within a predetermined range.

When the pressure in the mask-gas replacement chamber 7 falls to a predetermined value, the control section 9 supplies a predetermined gas into the mask-gas replacement chamber 7 using the gas supply device 81. As a result, the gas in the space GS formed between the pellicle PE and the mask M is replaced with the predetermined gas. An ideal curve is preset for the speed of supplying the predetermined gas in this case and the control section 9 controls the gas supply device 81 to adjust the supply amount so that the difference between the ideal curve and the output signal of the pressure sensor 87 becomes substantially zero or is within a predetermined range.

The mask M that has undergone gas replacement is loaded into the mask chamber 5 or the optical path space LS and is subjected to an exposure process in the same procedures as have been discussed in the foregoing description of the first embodiment.

As described above, the pressure in the mask-gas replacement chamber 7 is measured and the exhaust amount is adjusted based on the measuring result so that the pressure in the mask-gas replacement chamber 7 behaves along the ideal curve L2, thereby allowing the deformation of the pellicle PE to lie in a predetermined range. This can surely prevent the pellicle PE from being damaged and can also reduce the time needed for gas replacement.

The above-described method is so-called feedback control to adjust the exhaust amount by referring to the ideal curve (data table) L2 while monitoring the pressure Pr1 in the mask-gas replacement chamber 7. The gas replacement method may take the form of so-called open-loop control to drive the exhaust device 80 with the exhaust amount of the exhaust device 80 so preset as to follow the ideal curve L2. In the latter case, the structure does not require the memory device 86B.

Although the curve L2 is a straight line in this embodiment, it may be modified so that to suppress the difference between the internal and external pressures of the pellicle PE to prevent the pellicle PE from being damaged, the exhaust speed may be set low immediately after gas exhaust is started but may be increased as exhaust proceeds. In this case, the ideal line L2 becomes a curve.

In each embodiment discussed above, the gas in the mask-gas replacement chamber 7 is exhausted to lower the internal pressure to, for example, about 0.1 Pa after which the predetermined gas is supplied until the pressure rises slightly above the atmospheric pressure. Gas supply and gas exhaust may be carried out plural times in a single gas replacement. Specifically, this invention may employ a method of exhausting the gas from the mask-gas replacement chamber 7 to the pressure of 100 Pa, then temporarily supplying a predetermined gas there to raise the pressure to near the atmospheric pressure, and performing gas exhaust and the supply of the predetermined gas again in this situation. In this case, the gas exhaust and supply control becomes easier and the overall processing time becomes shorter. While gas exhaust under high pressure (e.g., a range from about 100 Pa to about 10 Pa) can be easily executed in a short period of time, gas exhaust under low pressure (e.g., a range from about 1 Pa to about 0.1 Pa) demands difficult control and takes time. Therefore, efficient gas replacement can be implemented by performing a plurality of sub operations for the gas exhaust and supply to acquire the target concentration of the light absorptive substance.

A third embodiment of the exposure apparatus equipped with the gas replacement method and apparatus of the invention will be discussed by referring to FIGS. 5A and 5B. To simplify or omit the description of the components of the third embodiment, like or same reference numerals are given to those components which are the same as or correspond to the components of the first and second embodiments.

Figure 5A:
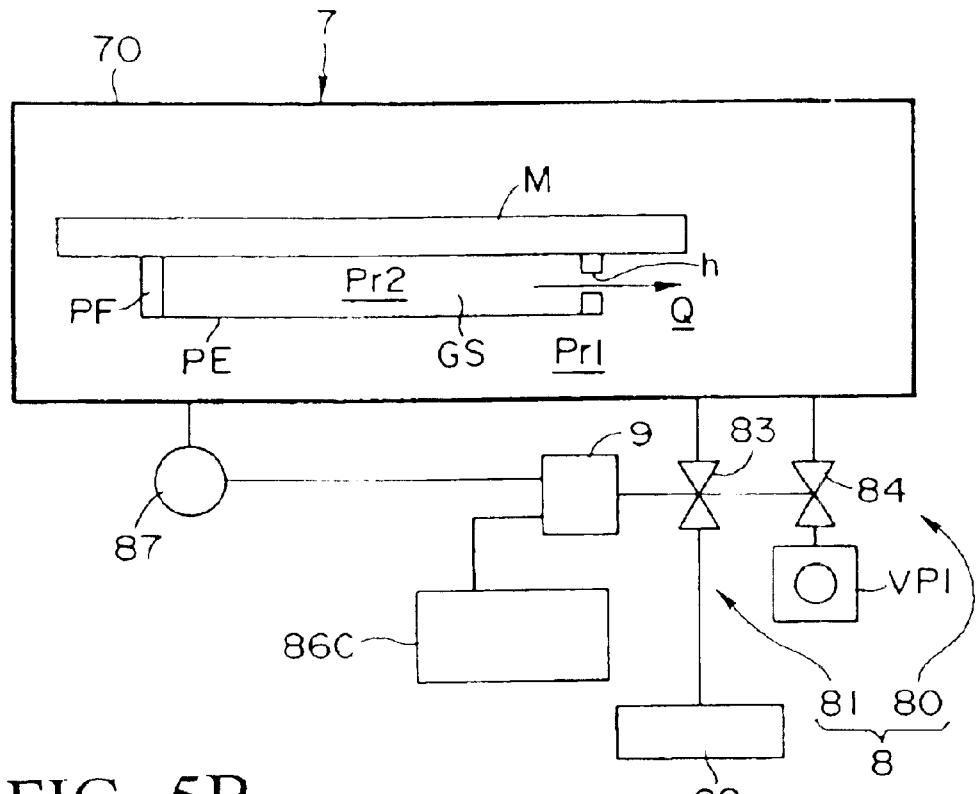
FIGS. 5A and 5B are diagrams for explaining a third embodiment of the gas replacement apparatus of the invention.

Referring to FIG. 5A, provided in the mask-gas replacement chamber (preliminary chamber) 7 which accommodates a mask M with a pellicle PE mounted thereon are the exhaust device 80 which exhausts the gas from the mask-gas replacement chamber 7, the pressure sensor (pressure measuring device) 87 which measures the pressure in the mask-gas replacement chamber 7, and the gas supply device 81 which supplies a predetermined gas into the mask-gas replacement chamber 7. The control section 9 is connected to the pressure sensor 87 so that the output signal of the sensor 87 is sent to the control section 9. The control section 9 controls the gas supply device 81 based on the result of the measurement made by the pressure sensor 87.

Also connected to the control section 9 is a memory device 86C where the relationship between a change in pressure in the mask-gas replacement chamber 7 and the deformation of the pellicle PE is prestored.

Figure 5B:
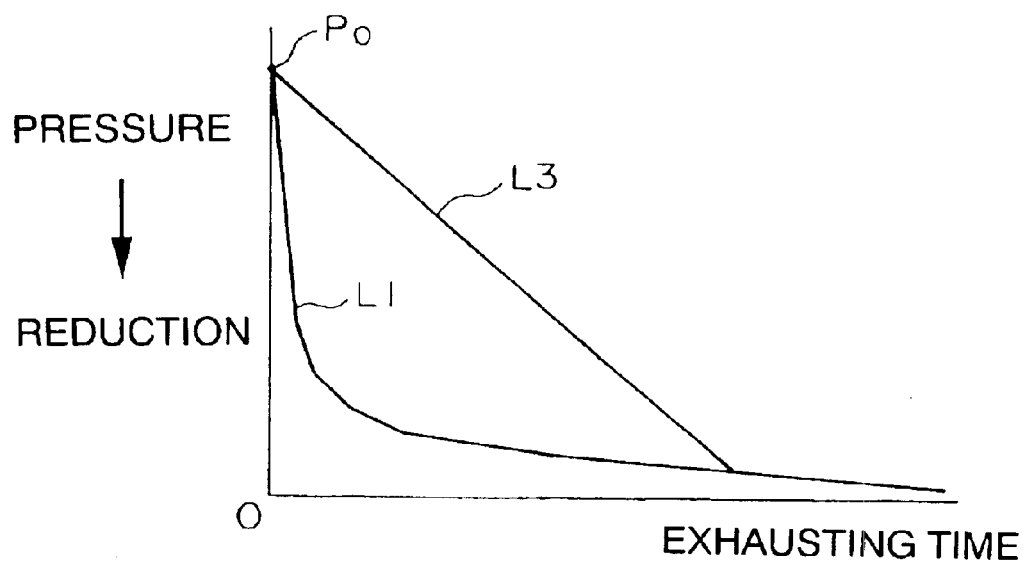

Specifically, the memory device 86C is holding data (ideal curve) L3 about the supply and exhaust speeds high enough to prevent the pellicle PE from being damaged by a change in pressure which is caused by gas replacement in the mask-gas replacement chamber 7 as shown in FIG. 5B.

The vertical scale in the graph shown in FIG. 5B represents the pressures in the mask-gas replacement chamber 7 and the space GS while the horizontal scale shows the exhaust time. When the exhaust time is "0", the pressures in the mask-gas replacement chamber 7 and the space GS become the atmospheric pressure (or 1 atmospheric pressure) P0.

The operation of the gas replacement apparatus that has the above structure will be described below.

In the embodiment, the exhaust device 80 exhausts the gas from the mask-gas replacement chamber 7 with the exhaust valve 84 merely open and the exhaust pump VP1 simply driven, and the gas supply device 81 supplies a predetermined gas so that the pressure in the mask-gas replacement chamber 7 follows the ideal curve L3.

That is, while the gas in the mask-gas replacement chamber 7 is exhausted, the predetermined gas is supplied into the mask-gas replacement chamber 7 so that the pressure in the chamber 7 follows the ideal curve L3. In this case, the control section 9 compares the result of the measurement made by the pressure sensor 87 with the ideal curve L3 and adjusts the supply amount of the predetermined gas using the gas supply device 81 so that the difference between them becomes substantially zero or is within a predetermined range.

In this case, the exhaust amount of the exhaust device 80 may be adjusted at the same time. In other words, at the time of supplying the predetermined gas into the mask-gas replacement chamber 7, at least one of the supply amount of the predetermined gas and the exhaust amount of the gas from the mask-gas replacement chamber 7 can be regulated so that the supply-originated deformation of the pellicle PE is within a predetermined range.

As discussed above, when the pressure in the mask-gas replacement chamber 7 reaches a predetermined value (e.g., 0.1 Pa) while the exhaust of the gas from the mask-gas replacement chamber 7 and the supply of the predetermined gas are executed at the same time, the control section 9 stops the exhaust device 80. Next, while causing the pressure sensor 87 to measure the pressure in the mask-gas replacement chamber 7, the control section 9 causes the gas supply device 81 to supply the predetermined gas so that the pressure follows the ideal curve L3. When the pressure in the mask-gas replacement chamber 7 becomes slightly higher than, for example, the atmospheric pressure, the control section 9 stops the gas supply device 81.

In carrying out gas replacement in the mask-gas replacement chamber 7, exhausting the gas from the chamber while supplying the predetermined gas there can set the concentration of the light absorptive substance in the mask-gas replacement chamber 7 to a target value more quickly.

In this case, this invention can employ the aforementioned method of dividing the gas replacement operation into sub operations of reducing the pressure in the mask-gas replacement chamber 7 to a predetermined value, then temporarily supplying a predetermined gas there to raise the pressure to near the atmospheric pressure, and performing gas exhaust and the supply of the predetermined gas again in this situation. Efficient gas replacement can be accomplished by the simultaneous execution of gas exhaust and gas supply and the execution of gas replacement in sub operations to acquire the target concentration of the light absorptive substance. In other words, for the same processing time or the same number of processes involved, the simultaneous execution of gas exhaust and gas supply can ensure more reliable gas replacement.

This embodiment can also employ so-called feedback control to adjust the exhaust amount by referring to the ideal curve L3 while monitoring the pressure Pr1 in the mask-gas replacement chamber 7 as well as so-called open-loop control to drive the gas supply device 81 with the supply amount of the gas supply device 81 so set previously as to follow the ideal curve L3.

A fourth embodiment of the exposure apparatus equipped with the gas replacement method and apparatus of the invention will be discussed by referring to FIGS. 6 and 7. To simplify or omit the description of the components of the fourth embodiment, like or same reference numerals are given to those components which are the same as or correspond to the components of the individual embodiments described above.

Although the gas replacement apparatus is placed in a closed chamber and the gas in the space GS formed between the pellicle PE and the mask M is replaced with a predetermined gas via the ventilation holes h by replacing the gas in the closed chamber according to the above-described embodiments, the gas replacement method of the fourth embodiment directly replaces the gas in the space GS with the predetermined gas.

Figure 6:
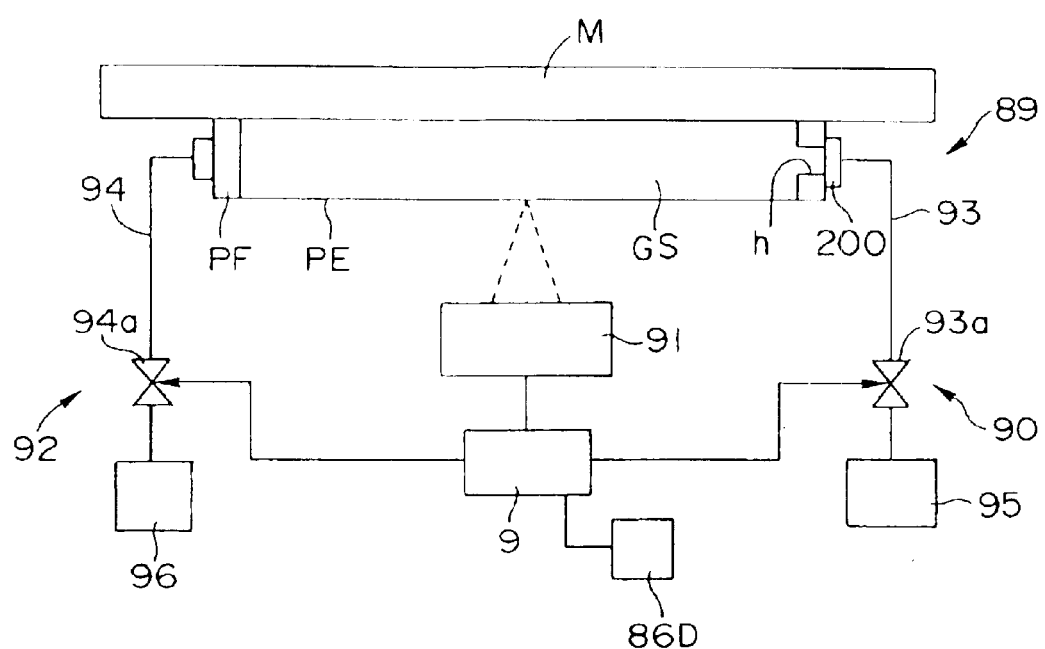
FIG. 6 is a diagram for explaining a fourth embodiment of the gas replacement apparatus of the invention.
Figure 7:
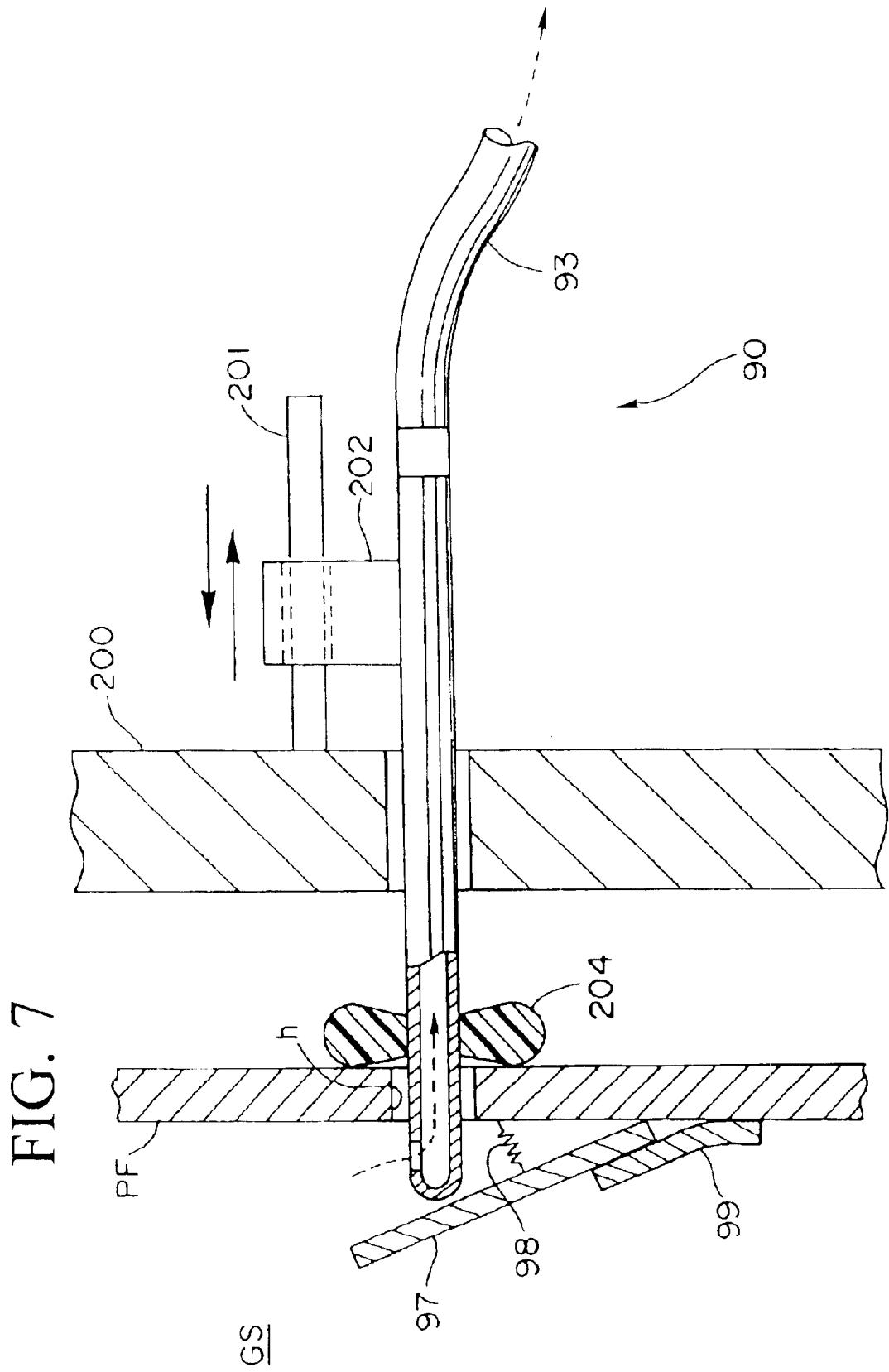
FIG. 7 is a diagram for explaining a part in FIG. 6 where a pipe and a ventilation hole are connected together.

As shown in FIGS. 6 and 7, a gas replacement apparatus 89 according to this embodiment includes an exhaust device 90 which exhausts the gas from the space GS formed between the mask M and the pellicle PE, a gas supplying device 92 which supplies a predetermined gas into the space GS, a deformation measuring device 91 which measures the deformation of the pellicle PE, and the control section 9 which adjusts at least one of the supply amount of the gas and the exhaust amount of the gas based on the result of the measurement made by the deformation measuring device 91 so that the deformation of the pellicle PE is within a predetermined range.

The exhaust device 90 has an exhaust pipe 93 which is attached to a ventilation hole h which is provided in the metal frame PF and communicates with the space GS, an exhaust valve 93a disposed in the exhaust pipe 93, and exhaust pump 95. The gas supplying device 92 has an intake pipe 94 attached to a ventilation hole h which communicates with the space GS, an intake valve 94a disposed in the intake pipe 94 and an unillustrated specific-gas source. An air filter for removing particles and a chemical filter for removing a light absorptive substance are provided in those exhaust pipe 93 and intake pipe 94.

Connected to the control section 9 is a memory device 86D where information about the deformation of the pellicle PE is stored. This information is data on the deformation small enough not to damage the pellicle PE. That is, the memory device 86D prestores the deformation range (predetermined range) in which the pellicle PE does not break. The pellicle PE is so set as not to break within this predetermined range. The predetermined range of the deformation of the pellicle PE can be acquired beforehand through experiments.

The control section 9 compares the result of the measurement made by the deformation measuring device 91 with the deformation information stored in the memory device 86D, and controls the opening/closing of the exhaust valve 93a, the activation/deactivation of the exhaust pump 95, the opening/closing of the intake valve 94a and the activation/deactivation of an intake pump 96.

As shown in FIG. 7, a lid 97 is provided on the side wall of the metal frame PF on the space (GS) side in the portion where the exhaust device 90 is connected to the ventilation hole h in the metal frame PF. The lid 97 is normally urged toward the side wall of the metal frame PF by springs 98 and 99, etc. Without any external force acting on the lid 97, therefore, the lid 97 is closely attached to the side wall of the metal frame PF, thus sealing a ventilation hole 53 air-tightly.

A support plate 200 is provided outside the metal frame PF and a guide member 201 is provided approximately perpendicularly on the surface of the support plate 200. A movable member 202 which reciprocates on the guide member 201 is integrally secured to the distal end of the exhaust pipe 93 of the exhaust device 90. The distal end of the exhaust pipe 93 is always inserted into an opening portion formed in the support plate 200.

As the movable member 202 is moved leftward in FIG. 7, therefore, the tip of the distal end of the exhaust pipe 93 is inserted into the ventilation hole h of the metal frame PF. Accordingly, the lid 97 opens inwardly (toward the space GS) and comes to the state as shown in FIG. 7. A seal member 204 is provided around near the tip of the distal end of the exhaust pipe 93. With the distal end of the exhaust pipe 93 fitted into the ventilation hole h, therefore, the outside air is prevented from entering the space GS.

The connection of the intake pipe 94 of the gas supplying device 92 to the ventilation hole h of the metal frame PF takes a similar structure.

When the gas replacement apparatus 89 having the above-described structure is used to perform gas replacement in the space GS, first, the exhaust device 90 exhausts the gas from the space GS until the internal pressure becomes a predetermined level. At this time, the control section 9 adjusts the exhaust amount by controlling the exhaust device 90 based on the result of the measurement made by the deformation measuring device 91 so that the deformation of the pellicle PE is within a predetermined range. For instance, the control section 9 reduces the exhaust amount when the deformation of the pellicle PE appears to go beyond the predetermined range, but increases the exhaust amount when the deformation is equal to or smaller than the predetermined range.

Next, the control section 9 causes the gas supplying device 92 to supply a predetermined gas into the space GS. At this time, the control section 9 adjusts the supply amount by controlling the gas supplying device 92 based on the result of the measurement made by the deformation measuring device 91 so that the deformation of the pellicle PE is within the predetermined range.

When the gas in the space GS is replaced with the predetermined gas, the control section 9 loads the mask M into the mask chamber 5 in the optical path space LS using the mask loader. Gas replacement in the space GS can be performed in any space different from the optical path space LS, including the mask-gas replacement chamber 7, for example. Alternatively, the mask M with the pellicle PE mounted thereon before gas replacement may be placed in the optical path space LS and gas replacement can be executed in this optical path space LS.

Although gas replacement in the space GS is performed by exhausting the gas from the space GS and then supplying the predetermined gas there, the gas exhaust from the space GS and the supply of the predetermined gas into the space GS may be carried out simultaneously while making such control as to make the deformation of the pellicle PE fall within the predetermined range.

Although the above-described gas replacement method adjusts at least one of the exhaust amount of the gas and the supply amount of the gas based on the result of the measurement made by the deformation measuring device 91, gas replacement may be achieved through so-called open-loop control that executes gas replacement based on the exhaust amount of the gas and the supply amount of the gas that are large enough to prevent the pellicle PE from being broken. In this case, the gas replacement apparatus does not require the deformation measuring device 91 and the memory device 86D.

The gas exhaust and supply may be accomplished by performing a plurality of sub operations in this embodiment too.

In the fourth embodiment, an impurity sensor (e.g., an oxygen concentration sensor) may be disposed in the exhaust pipe 93 to monitor the state of gas replacement in the space GS.

In the second and third embodiments, a deformation measuring device which measures the deformation of the pellicle PE may be provided to monitor the deformation state of the pellicle PE.

The same type of predetermined gas is fed into the illumination-system housing 20, the mask chamber 5, the projection-system housing 30, the wafer chamber 6, the mask-gas replacement chamber 7 and the wafer-gas replacement chamber 10 in the individual embodiments. The advantage of this system is that one need to prepare only one type of gas (including a gas mixture). This invention is not limited to this particular system, but may use different types of gas as predetermined gases to be supplied into the individual sections. When a single gas, such as nitrogen, helium, neon or argon, is used as a predetermined gas, however, it is desirable that at least the gases to be supplied to the mask chamber 5 and the mask-gas replacement chamber 7 should be the same and the gases to be supplied to the wafer chamber 6 and the wafer-gas replacement chamber 10 should likewise be the same in order to avoid a gas mixture.

Although the mask-gas replacement chamber 7 is located adjacent to the mask chamber 5 in each embodiment, such adjoining provision is not essential. For example, a preliminary chamber (mask-gas replacement chamber) may be provided in the mask library with a predetermined gas filling a passage from the library to the optical path space LS. Likewise, the wafer-gas replacement chamber 10 and the wafer chamber 6 should not necessarily be provided adjacent to each other.

Two mask-gas replacement chambers 7 may be provided, one for loading of the mask M and the other for unloading of the mask M, so that the operation of unloading the mask M from the mask chamber 5 and the operation of loading the mask M into the mask chamber 5 in each of the above-described embodiments are executed in parallel. In this case, while gas replacement in the mask-gas replacement chamber 7 exclusive for mask unloading should be completed before mask unloading, the time for changing the mask M can be shortened as the mask M can be moved out of the mask-gas replacement chamber 7 without waiting for the mask M to be loaded into the mask chamber 5. Likewise, providing two wafer-gas replacement chambers 10 can shorten the time for changing the wafer W.

In each embodiment, the mask chamber 5 may be provided with the ability of a mask-gas replacement chamber. In this case, as the gas in the mask chamber 5 is replaced with a predetermined gas, gas replacement in the space GS can be executed at the same time.

In each embodiment, because a material with a reduced surface roughness, such as stainless steel (SUS), is used for the partition 50 of the mask chamber 5, the partition 60 of the wafer chamber 6, the partition 70 of the mask-gas replacement chamber 7, the partition 100 of the wafer-gas replacement chamber 10, the illumination-system housing 20 of the illumination optical system 2, the projection-system housing 30 of the projection optical system 3 and the supply pipes or the like for the predetermined gas, the occurrence of degassing is suppressed.

Note that the mask chamber 5 is formed by the first housing made of the partition 50, the wafer chamber 6 is formed by the second housing made of the partition 60, the mask-gas replacement chamber 7 is formed by the third housing made of the partition 70, and the wafer-gas replacement chamber 10 is formed by the fourth housing made of the partition 100.

The minimum number of holes to be formed in the metal frame PF are two, one for supplying a predetermined gas into the space GS and one for exhausting a gas from the space GS. The number of the holes is not limited to one for each of the gas exhaust and gas supply, but a plurality of holes may be provided for each operation.

The material for the metal frame PF in each embodiment is not limited to metal, but may be a glass material. The glass material may be fluoride crystal, such as fluorite or lithium fluoride, or a fluorine-doped quartz. The material may be the same as the one used for the optical members that constitute the projection optical system.

The wafers W according to the invention include a ceramic wafer for thin-film magnetic heads as well as a semiconductor wafer for semiconductor devices and a glass plate for liquid crystal display devices.

The exposure apparatus 1 is not limited to a step and repeat type exposure apparatus (stepper) which exposes the pattern of the mask M with the mask M and wafer W being still and sequentially moves the wafer W stepwise, but may be adapted to a step and scan type exposure apparatus (scanning stepper) which exposes the pattern of the mask M on the wafer W by synchronously moving the mask M and the wafer-W.

The exposure apparatus 1 can be adapted to a variety of exposure apparatuses, such as the above-described exposure apparatus for fabricating semiconductor devices, an exposure apparatus for manufacturing liquid crystal display devices, and an exposure apparatus for manufacturing thin-film magnetic heads, image pickup devices (CCDs) or masks M.

Available as the light source 21 of the illumination optical system 2 are charge particle rays, such as X rays and an electron beam, as well as bright rays generated from a mercury lamp (g rays (436 nm), h rays (404.7 nm), i rays (365 nm), KrF excimer laser (248 nm), ArF excimer laser (193 nm) and $F_2$ laser (157 nm). In the case of using an electron beam, for example, thermionic emission type lanthanum hexaborite ($LaB_6$) or tantalum (Ta) as an electron gun. Further, harmonic waves produced by a YAG laser, a semiconductor laser or the like may be used as well.

The projection optical system 3 is not limited to a reduction type, but may be either an equal magnification or a magnifying type.

With regard to the projection optical system 3, when extreme ultraviolet radiation, such as an excimer laser beam, are used, a material which transmits extreme ultraviolet radiation, such as a quartz or fluorite, should be used as a glass material, and when an $F_2$ laser or X rays are used, reflection/refraction optical system or a refraction optical system (a reflection type reticle should be used in this case) should be used. In the case of using an electron beam, the optical system that should be used is an electron optics system comprised of an electronic lens and a deflector. The optical path where the electron beam passes should be vacuumed.

When a linear motor is used for the wafer stage or the mask holder, either an air float type using an air bearing or a magnetic float type using Lorentz force or reactance force may be used.

The wafer stage and mask holder may be designed to move along guides or may be of a guide-less type that requires no guides.

When a plane motor is used as the stage driving unit, one of a magnetic unit (permanent magnet) and an armature unit should be connected to the stage while the other one should be provided on the moving surface side (base) of the stage.

The reactive force that is generated by the movement of the wafer stage may be mechanically allowed to escape into the floor (ground) by using a frame member as described in Japanese Patent Application, First Publication No. Hei 08-166475. This invention may be adapted to an exposure apparatus which has such a structure.

The reactive force that is generated by the movement of the mask stage may be mechanically permitted to escape into the floor (ground) by using a frame member as described in Japanese Patent Application, First Publication No. Hei 08-330224. This invention may also be adapted to an exposure apparatus which has such a structure.

As described above, the exposure apparatus of this embodiment is constructed by assembling various sub systems including the individual constituting elements as recited in the appended claims while keeping a predetermined mechanical precision, electrical precision and optical precision. To guarantee those precisions, various optical systems are adjusted to achieve the optical precision, various mechanical systems are adjusted to achieve the mechanical precision and various electric systems are adjusted to achieve the electrical precision before and after the assembly. The process of assembling various sub systems into the exposure apparatus includes mechanical connection of various sub systems, interconnection of electric circuits and connecting pipes to a pressure circuit. The process of assembling each sub system comes before the process of assembling various sub systems into the exposure apparatus. When assembling various sub systems into the exposure apparatus is completed, general adjustment is carried out to guarantee various precisions of the exposure apparatus as a whole. It is desirable to manufacture the exposure apparatus in a clean room where the temperature and the degree of cleanness are controlled.

As shown in FIG. 8, a semiconductor device is fabricated through step 301 of designing the functions and performance of the device, step 302 of producing masks based on this design step, step 303 of producing a substrate (wafer or glass plate) that is the base of the device, substrate processing step 304 of exposing the pattern of a mask on the substrate (wafer) using the exposure apparatus of the above-described embodiment, device assembling step 305 (including a dicing step, bonding step and packaging step) and inspection step 306.

What is claimed is:

1. An exposure method comprising:
   accommodating a mask, on which a protection member is provided via a frame, in a closed chamber having at least one of a first space including an optical path of exposure light and a second space adjacent to said first space;
   replacing a gas in said closed chamber with a predetermined gas having low absorption characteristic of said exposure light with regard to a material which absorbs said exposure light, while adjusting an exhaust amount of the gas from said closed chamber so that deformation of said protection member is within a predetermined range;
   replacing a gas in a predetermined space surrounded by said protection member, said mask, and said frame with said predetermined gas via a hole formed in said frame according to replacing the gas in said closed chamber; and
   irradiating said exposure light onto said mask after replacing said gas in said predetermined space with said predetermined gas, and transferring an image of a pattern of said mask onto a substrate.

2. An exposure method according to claim 1, wherein said predetermined gas is supplied to said closed chamber so that deformation of said protection member is within the predetermined range.

3. An exposure method according to claim 1, wherein a plurality of holes is formed in said frame, and said gas in said predetermined space is replaced with said predetermined gas via said plurality of hole.

4. An exposure method according to claim 1, wherein deformation of said protection member is monitored during replacement of said gas in said predetermined space with said predetermined gas.

5. An exposure method according to claim 4, wherein a supply amount of said predetermined gas to be supplied into said closed chamber and an exhaust amount of gas in said closed chamber are controlled based on a deformation amount of said protection member which has been monitored.

6. An exposure method comprising:
   accommodating a mask, on which a protection member is provided via a frame, in a closed chamber having at least one of a first space including an optical path of exposure light and a second space adjacent to said first space;
   replacing a gas in said closed chamber with a predetermined gas having low absorption characteristic of said exposure light with regard to a material which absorbs said exposure light, while supplying said predetermined gas to said closed chamber so that deformation of said protection member is within the predetermined range;
   replacing a gas in a predetermined space surrounded by said protection member, said mask, and said frame with said predetermined gas via a hole formed in said frame according to replacing the gas in said closed chamber; and irradiating said exposure light onto said mask after replacing said gas in said predetermined space with said predetermined gas, and transferring an image of a pattern of said mask onto a substrate.

7. An exposure method comprising:

accommodating a mask on which a protection member is provided via a frame in a closed chamber having at least one of a first space including an optical path of exposure light and a second space adjacent to said first space;

replacing a gas in a predetermined space surrounded by said protection member, said mask, and said frame via a hole formed in said frame with a predetermined gas having low absorption characteristic of said exposure light with regard to a material which absorbs said exposure light in said closed chamber;

controlling deformation of said protection member to within a predetermined range while replacing the gas in said predetermined space with said predetermined gas; and after said gas in said predetermined space is replaced with said predetermined gas, irradiating said exposure light onto said mask and transferring an image of a pattern of said mask onto a substrate.

8. An exposure method according to claim 7, wherein a plurality of said holes is formed in said frame, and said gas in said predetermined space is replaced with said predetermined gas via said plurality of said holes.

9. An exposure method according to claim 8, wherein a gas supply device which supplies said predetermined gas is connected to one of said plurality of holes, and an exhaust device which exhausts a gas in said predetermined space is connected to a hole which is different from the hole connected to said gas supply device.

10. An exposure method according to claim 9, wherein deformation of said protection member is monitored during replacement of said gas in said predetermined space with said predetermined gas.

11. An exposure method according to claim 10, wherein based on a deformation amount of said protection member which has been monitored, said gas supply device and said exhaust device are controlled, and a supply amount of said predetermined gas which is to be supplied into said predetermined space and an exhaust amount of a gas to be exhausted from said predetermined space are controlled.

12. An exposure apparatus comprising:

a closed chamber which accommodates a mask on which a protection member is provided via a frame, said closed chamber having at least one of a first space including an optical path of exposure light and a second space adjacent to said first space;

a gas replacement apparatus which is provided in said closed chamber and replaces a gas in said closed chamber with a predetermined gas having low absorption characteristic of said exposure light with regard to a material which absorbs said exposure light; and a deformation measuring device which is connected to said gas replacement apparatus and measures deformation of said protection member during replacement of said gas in said closed chamber with said predetermined gas.

13. An exposure apparatus according to claim 12, wherein said gas replacement apparatus comprises:

an exhaust device which is connected to said closed chamber and exhausts a gas in said closed chamber; and a control device which is connected to said deformation measuring device and controls exhausting of said gas in said closed chamber by said exhaust device based on a result of measurement so that said deformation is within a predetermined range.

14. An exposure apparatus according to claim 13, wherein said gas replacement apparatus comprises a gas supply device which is connected to said closed chamber and supplies said predetermined gas into said closed chamber; and said control device controls supply of said predetermined gas into said closed chamber by said gas supply device so that said deformation is within a predetermined range.

15. An exposure apparatus according to claim 12, wherein said gas replacement apparatus comprises:

an exhaust device which is connected to said closed chamber and exhausts a gas in said closed chamber;

a gas supply device which is connected to said closed chamber and supplies said predetermined gas into said closed chamber; and a control device which is connected to said deformation measuring apparatus, controls exhaust of a gas of said closed chamber by said exhaust device and controls supply of said predetermined gas into said closed chamber by said gas supply device based on a result of a measurement so that said deformation is within a predetermined range.

16. An exposure apparatus comprising:

a closed chamber which accommodates a mask on which a protection member is provided via a frame, said closed chamber having at least one of a first space including an optical path of exposure light and a second space adjacent to said first space;

a gas replacement apparatus which is provided in said closed chamber and replaces a gas in said closed chamber with a predetermined gas having low absorption characteristic of said exposure light with regard to a material which absorbs said exposure light;

a pressure measuring device which is connected to said closed chamber and measures a pressure in said closed chamber; and a control device which is connected to said pressure measuring device and controls said gas replacement apparatus based on a result of measurement from said pressure measuring device so that a deformation of said protection member is within a predetermined range during replacement of said gas in said closed chamber with said predetermined gas.

17. An exposure apparatus according to claim 16, wherein said gas replacement apparatus comprises an exhaust device which is connected to said closed chamber and exhausts a gas in said closed chamber; and said control device controls exhausting of said gas in said closed chamber by said exhaust device so that said deformation of said protection member is within a predetermined range.

18. An exposure apparatus according to claim 17, wherein said gas replacement apparatus comprises a gas supply device which is connected to said closed chamber and supplies said predetermined gas into said closed chamber; and said control device controls supply of said predetermined gas into said closed chamber by said gas supply device so that said deformation is within a predetermined range.

19. An exposure apparatus according to claim 16, wherein said gas replacement apparatus comprises:
an exhaust device which is connected to said closed chamber and exhausts a gas in said closed chamber;
a gas supply device which is connected to said closed chamber and supplies said predetermined gas into said closed chamber; and
a control device which is connected to said deformation measuring apparatus, controls exhaust of a gas in said closed chamber by said exhaust device and controls supply of said predetermined gas into said closed chamber by said gas supply device based on a result of measurement so that said deformation is within a predetermined range.

20. An exposure apparatus according to claim 19, comprising a storage apparatus which is connected to said control device, stores a pressure change occurring inside said closed chamber and stores a deformation of said protection member corresponding to said pressure change, wherein
said control device controls exhaust of a gas in said closed chamber by said exhaust device and controls supply of said predetermined gas into said closed chamber by said gas supply device based on a relationship between said pressure change and said deformation of said protection member which are stored in said storage apparatus.

21. An exposure apparatus comprising:
a closed chamber which accommodates a mask on which a protection member is provided via a frame, said closed chamber having at least one of a first space including an optical path of exposure light and a second space adjacent to said first space;
a gas replacement apparatus which is connected to at least one of a plurality of holes formed in said frame, and replaces a gas in a predetermined space surrounded by said protection member, said mask, and said frame with a predetermined gas having low absorption characteristic of said exposure light with regard to material which absorbs said exposure light; and
a control apparatus which is connected to said gas replacement apparatus and controls said gas replacement apparatus so that deformation of said protection member is within a predetermined range.

22. An exposure apparatus according to claim 21, wherein said gas replacement apparatus is disposed in a space adjacent to a space including said optical path of said exposure light.

23. An exposure apparatus according to claim 22, wherein said gas replacement apparatus comprises a gas supply device which is connected to at least one of said plurality of holes and supplies said predetermined gas into said predetermined space, and an exhaust device which is connected to a hole which is different from the hole connected to said gas supply device and supplies said gas in said predetermined space thereto.

24. An exposure apparatus according to claim 23, comprising a deformation measuring device which is connected to said gas replacement apparatus and measures deformation of said protection member during replacement of said gas in said predetermined space with said predetermined gas.

25. An exposure apparatus according to claim 24, comprising a control device which is connected to said deformation measuring device and controls at least one of supply of said predetermined gas into said predetermined space by said gas supply device and exhaust of said gas from said predetermined space by said exhaust device.

26. An exposure method comprising:
accommodating a mask, on which a protection member is provided via a frame, in an accommodating space;
replacing a gas in a predetermined space surrounded by said protection member, said mask, and said frame with a predetermined gas having low absorption characteristic of exposure light with regard to a material which absorbs said exposure light via a hole formed in said frame;
controlling deformation of said protection member to within a predetermined range while replacing the gas in said predetermined space with said predetermined gas; and
irradiating said exposure light onto said mask after replacing the gas in said predetermined space with said predetermined gas, and transferring an image of a pattern of said mask onto a substrate.

27. An exposure method according to claim 26, wherein a plurality of said holes are formed in said frame, and the gas in said predetermined space is replaced with said predetermined gas via said plurality of holes.

28. An exposure method according to claim 26, wherein deformation of said protection member is monitored while the gas in said predetermined space is replaced with said predetermined gas.

29. An exposure method according to claim 28, wherein a supply amount of said predetermined gas supplied to said predetermined space is adjusted based on a deformation amount of the monitored protection member.

30. An exposure method according to claim 29, wherein an exhaust amount of the gas from said predetermined space is adjusted based on a deformation amount of the monitored protection member.

31. An exposure method according to claim 26, wherein a supply amount of said predetermined gas supplied to said predetermined space is adjusted so that deformation of said protection member is within the predetermined range.

32. An exposure apparatus using a mask on which a protection member is provided via a frame, comprising:
a gas replacement apparatus which determines a position of at least one of a plurality of holes formed in said frame and replaces a gas in a predetermined space surrounded by said protection member, said mask, and said frame with a predetermined gas having low absorption characteristic of an exposure light with regard to a material which absorbs said exposure light; and
a control apparatus which is connected to said gas replacement apparatus and controls said gas replacement apparatus so that deformation of said protection member is within a predetermined range.

33. An exposure apparatus according to claim 32, wherein said gas replacement apparatus is arranged in a space adjacent a space containing a light path of said exposure light.

34. An exposure apparatus according to claim 32, wherein said gas replacement apparatus comprises a supply apparatus which is connected to one of said plurality of holes and supplies said predetermined gas to said predetermined space.

35. An exposure apparatus according to claim 34, wherein said gas replacement apparatus comprises an exhaust apparatus which is connected to a hole different to the hole to which said supply apparatus is connected and which exhausts the gas in said predetermined space.

36. An exposure apparatus according to claim 32, further comprising:

a deformation measuring apparatus which is connected to said gas replacement apparatus and detects deformation of said protection member while replacing the gas in said predetermined space with said predetermined gas.

37. An exposure apparatus according to claim 36, wherein said gas replacement apparatus comprises a supply apparatus which is connected to at least one of said plurality of holes and supplies said predetermined gas to said predetermined space, and said control apparatus controls a supply amount of said predetermined gas supplied to said predetermined space based on results of measurement of said deformation measurement apparatus.

* * * * *